(12) United States Patent
Kariat et al.

(10) Patent No.: US 7,877,713 B2
(45) Date of Patent: *Jan. 25, 2011

(54) METHOD AND APPARATUS FOR SUBSTRATE NOISE ANALYSIS USING SUBSTRATE TILE MODEL AND TILE GRID

(75) Inventors: Vinod Kariat, Sunnyvale, CA (US); Xiaopeng Dong, San Jose, CA (US); David Noice, Palo Alto, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 719 days.

This patent is subject to a terminal disclaimer.

(21) Appl. No.: 11/769,670

(22) Filed: Jun. 27, 2007

(65) Prior Publication Data

US 2009/0007032 A1 Jan. 1, 2009

(51) Int. Cl.
*G06F 17/50* (2006.01)
(52) U.S. Cl. .................................. 716/4; 716/5; 716/7
(58) Field of Classification Search ............... 716/1–5, 716/7–11
See application file for complete search history.

(56) References Cited

U.S. PATENT DOCUMENTS

| | | | |
|---|---|---|---|
| 5,459,349 A | 10/1995 | Kobatake | |
| 2005/0257077 A1* | 11/2005 | Dutta et al. ................. | 713/340 |
| 2006/0184904 A1* | 8/2006 | Murgai et al. .................. | 716/4 |
| 2007/0156379 A1 | 7/2007 | Kulkarni et al. | |
| 2007/0288219 A1 | 12/2007 | Zafar et al. | |
| 2008/0072182 A1 | 3/2008 | He et al. | |
| 2008/0093560 A1 | 4/2008 | Puhakka et al. | |
| 2009/0006065 A1 | 1/2009 | Kariat et al. | |

OTHER PUBLICATIONS

EDA for IC Implementation, Circuit Design, and Process Technology, Edited by L. Schaffer, L. Lavagno and G. Martin, Chapter 20, Design and Analysis of Power Supply Networks, by D. Blaauw, S. Pant, R. Chaudhry and R. Panda, pp. 20-1 to 20-14, CRC Press, 2006.
Pant, S. and Blaauw, D., Timing-Aware Decoupling Capacitance Allocation in Power Distribution Networks, University of Michigan, Ann Arbor, MI, ASP-DAC -07, Asia and South Pacific, pp. 757-762 (Jan. 2007).
Checka N., Substrate Noise Analysis and Techniques for Mitigation in Mixed-Signal RF Systems, MIT 2005.

(Continued)

*Primary Examiner*—Paul Dinh
(74) *Attorney, Agent, or Firm*—Schwegman, Lundberg & Woessner, P.A.

(57) ABSTRACT

A method is provided to evaluate substrate noise propagation in an integrated circuit design, the method comprising: providing a tile definition that specifies an electrical model associated with instances of the tile; mapping a plurality of respective tile instances to respective locations of the substrate; obtaining respective waveforms indicative of digital switching induced power grid fluctuations associated with the respective identified contacts; and associating a voltage with a selected tile instance of the tile grid that is indicative of substrate noise injection due to waveforms associated with contacts encompassed by the selected tile instance.

18 Claims, 18 Drawing Sheets

OTHER PUBLICATIONS

Dharchoudhury, A., Panda, R., Blaauw, D., Valdyanathan, R., Tutulanu, B., and Bearden, D., Design and Analysis of Power Distribution networks in PowerPC Microprocessors, 1998.

Nagata, M. and Iwata, A., Substrate Crosstalk Analysis in Mixed Signal CMOS Integrated Circuits, Design Automation Conference, 2000. Proceedings of the ASP-DAC 2000. Asia and South Pacific Volume , Issue , 2000 pp. 623-629.

Sato, T., Hashimoto, T., Sasagawa, R., LSI Noise Model for Power Integrity Analysis and Its Application, Fujitsu Sci. Tech. J., 42.2, p. 266-273 (Apr. 2006).

Kao, WH and Chu, WK, Noise Constraint Driven Placement for Mixed Signal Designs, Proceedings of the 2003 International Symposium on Circuits and Systems, 2003, vol. 4, Issue , May 25-28, 2003 pp. IV-712-IV-715 vol. 4.

Cho, M., Shin, H., Pan, DZ, Fast Substrate Noise-Aware Floorplanning with Preference Directed Graph for Mixed-Signal SOCs, Proceedings of the 2006 conference on Asia South Pacific design automation, pp. 765-770.

U.S. Appl. No. 11/769,675, Non Final Office Action mailed Jan. 22, 2010, 9 pgs.

U.S. Appl. No. 11/769,675, Response filed Apr. 22, 2010 to Non Final Office Action mailed Jan. 22, 2010, 10 pgs.

U.S. Appl. No. 11/769,675 Final Office Action mailed Jul. 15, 2010, 12 pgs.

\* cited by examiner

| grd 1 | grd 2 | grd 3 | grd 4 | blk1 25 | blk1 26 |
|---|---|---|---|---|---|
| grd 5 | blk2 6 | blk2 7 | grd 8 | | |
| grd 9 | blk2 10 | blk2 11 | grd 12 | blk1 27 | blk1 28 |
| grd 13 | blk2 14 | blk2 15 | grd 16 | | |
| grd 17 | blk2 18 | blk2 19 | grd 20 | blk1 29 | blk1 30 |
| grd 21 | grd 22 | grd 23 | grd 24 | | |
| blk1 31 | blk1 32 | blk1 33 | blk1 34 | | |
| blk1 35 | blk1 36 | blk1 37 | blk1 38 | | |

FIG. 3A

METHOD AND APPARATUS FOR SUBSTRATE NOISE ANALYSIS USING SUBSTRATE TILE MODEL AND TILE GRID

CROSS REFERENCE TO RELATED APPLICATION

The subject matter of this application is related to that of commonly owned U.S. patent application Ser. No. 11/769,675, entitled METHOD TO PRODUCE SUBSTRATE NOISE MODEL AND RELATED SYSTEM AND ARTICLE OF MANUFACTURE, filed Jun. 27, 2007, which is expressly incorporated herein by this reference.

BACKGROUND OF THE INVENTION

1. Field of the Invention

The invention relates in general to simulation during design of integrated circuits and more particularly, to simulation to estimate integrated circuit substrate noise.

2. Description of the Related Art

FIG. 1 is an illustrative perspective view of a mixed-signal integrated circuit that includes a digital subsystem and an analog subsystem and that also includes a cross-section view of the IC substrate. The digital and analog subsystems are physically separated in different circuit blocks. Even though the digital and analog blocks of the integrated circuit (IC) may be separated by relatively large distances, they are nevertheless electrically coupled through a shared substrate. The substrate is a conductive medium vulnerable to a phenomenon called "substrate noise" or "substrate coupling". Substrate noise can result in un-intended interaction between the digital and analog components of a chip through the underlying silicon substrate. Analog systems generally lack the degree of noise immunity of digital circuits, and the substrate coupling noise can degrade analog performance.

Digital circuits typically operate with two discrete voltages, one corresponding to logic 0 and another corresponding to logic 1. Usually, the logic 1 value is encoded as the power supply voltage (or $V_{DD}$), and logic 0 is encoded as the ground voltage (or 0, or $V_{SS}$) in CMOS digital chips. During circuit operation, the signals on the digital portion switch from logic 1 to logic 0 or vice versa. In other words, the voltage on the signal line changes from one extreme allowed voltage to the other.

Analog circuits usually operate with voltage values that represent continuous analog behavior rather than switch between discrete voltages. Analog circuit examples include oscillators, Analog-to-Digital and Digital-to-Analog converters, mixers, amplifiers. Analog circuits typically operate with signals that are significantly smaller in amplitude than digital signals. Analog circuits are, therefore, generally more sensitive to effects of substrate noise than are digital circuits.

Substrate noise can cause fluctuations in the voltage potential of the substrate, which can affect CMOS device behavior. For example, it can change the threshold voltage of a CMOS transistor. For a digital circuit, this could result in a small change in the delay of a logic gate. However, for an analog circuit, the effect can be much more severe. For instance, in an amplifier, a change in threshold voltage can change the operating point of the amplifier and significantly reduce the gain. In a filter, it can reduce the noise margin.

Digital circuit switching generates substrate noise through multiple mechanisms. For instance, digital circuit switching results in substrate noise injection to the substrate from the junction of a digitally switching transistor. Also, digital circuit switching results in substrate noise injection due to power supply fluctuations. More noise ordinarily will be injected to the substrate from areas of the IC with a higher density of digital transistors. The power supply rails of an IC are tied at periodic intervals to the substrate using electrical contacts. This ensures that the substrate is kept at a desired potential. Especially in the digital circuit blocks of the chip, significant current is drawn on the power supply rails, and the power supply voltage fluctuates as a function of the switching activity. This voltage fluctuation is transferred to the substrate through the electrical contacts, and gets propagated through the substrate, eventually reaching the analog circuit blocks of the chip. The variation in power supply voltages can be exacerbated by inductance of the power supply lines bringing power to the chip, as well as by on-chip inductances.

In a CMOS circuit, electrical contacts comprise n+ and p+ diffusion regions adjacent NMOS or PMOS devices that are used to set the bulk terminal of the device to either ground or $V_{DD}$ depending on device type. When a digital signal transition occurs, a spike of current from the power supply is used to charge the output load. A significant portion of the current is discharged to ground, which the substrate ultimately connects to. In general, noise injection from the power supply fluctuation is a more significant substrate noise source than noise injection from switching transistors.

These discharge currents work in tandem with the parasitics of the power and ground lines to cause ringing in the supplies. However, since the substrate is connected to power and ground through low resistance substrate contacts, any such noise that appears on the power and ground lines appears also directly in the substrate. Once the noise has been injected into the substrate, it can propagate throughout the substrate. Although noise may be attenuated by the resistance of the substrate, it still can reach all areas of the chip. Substrate voltage fluctuations that reach analog transistors can have a detrimental impact upon their operation as described above.

An objective of substrate noise analysis is to estimate the substrate noise at the substrate terminals of sensitive analog devices. This information can be used to predict whether an analog circuit will function properly in the presence of substrate noise. More commonly, the substrate noise estimate can be used to decide the relative goodness of different chip floorplan alternatives, and to decide upon a floorplan that is acceptable in view of the estimated impact of substrate noise upon analog circuit performance. Substrate noise estimation also can be used to guide power supply design; if more power supply pins and higher decoupling is provided, the power supply lines will have less fluctuation, leading to less substrate noise.

In the past, substrate noise analysis often involved identification of substrate noise sources from simulation of digital circuit switching. Identification of substrate noise sources through simulation was especially challenging since it required not only knowledge of digital switching activity, but also identification of the actual source and physical location of the noise injectors that cause noise. Identification of the noise sources and their locations using circuit simulation could be particularly difficult.

Also, in the past, substrate noise analysis typically involved detailed extraction of an equivalent model of the substrate including resistance and capacitance. To accurately develop the substrate model, the complex geometries of IC structures such as, wells, contacts, well taps, diffusions and trenches were extracted from a design in the form of an RC network. However, such a shape-based extraction requires detailed information from semiconductor process recipes. Since this information often is not available until later in the design flow, it often was impractical to do perform satisfactorily accurate shape based extraction earlier in the design process. Moreover, such detailed extraction can be quite expensive in terms of run time and memory requirements.

As a result, estimates of substrate noise not only could be expensive, but also could be less effectual earlier in the design process before the availability of accurate detailed information concerning the substrate.

Thus, there has been a need for improvements to IC substrate noise analysis, especially during early stages of the IC design process when there is incomplete substrate information. The present invention meets this need.

SUMMARY OF THE INVENTION

In accordance with aspects of some embodiments of the invention, a method to evaluate substrate noise propagation in an integrated circuit design is provided. A tile definition specifies an electrical model associated with instances of the defined tile type that represents electrical behavior of a representative portion of the substrate. The tile definition also specifies a physical dimension associated with instances of the defined tile type. The physical dimension information is indicative of area encompassed by the tile defined tile type. Instances of the defined tile type are mapped to respective locations of the substrate that have electrical behavior of the representative portion. The mapped tile instances are connected to each other to produce a tile grid that models electrical behavior of the substrate. A voltage is associated value with a selected tile instance of the tile grid that is indicative of substrate noise injection to the selected tile instance.

In another aspect of some embodiments of the invention, power grid contacts are identified that are encompassed by physical dimensions of tile instances mapped to locations of the substrate. Waveforms indicative of digital switching induced power grid fluctuations are associated with the identified contacts. The voltage associated with a selected tile instance is indicative of substrate noise injection to the selected tile instance due to obtained waveforms associated with contacts identified as encompassed by the physical dimension specified for the selected tile instance.

Thus, tile instances model behavior of representative portions of a substrate. A grid of interconnected tile instances represents overall substrate noise propagation behavior. A voltage waveform can be associated with the selected instance that is indicative of digital switching induced power grid fluctuations experienced by contacts encompassed by the selected tile instance. The voltage waveform can model power grid noise injection at the location of the selected tile instance, and the tile grid models propagation of the injected noise throughout the substrate.

Accordingly, expensive detailed extraction is not required. Also, the use of simplified models facilitates substrate noise analysis earlier in a design process before detailed design information is available.

In some embodiments, waveforms are obtained from the results of a dynamic power grid analysis process, which obviates the need for identification of substrate noise sources from simulation of digital circuit switching.

These and other features and advantage of the invention will become more apparent from the following detailed description thereof in conjunction with the appended drawings.

BRIEF DESCRIPTION OF THE DRAWINGS

FIG. 3A-3B are illustrative drawings of an example tile grid (FIG. 3A) and of a a tile instance definition (FIG. 3B) that specifies an electrical model and physical dimension information for tile instances in accordance with some embodiments of the invention.

DETAILED DESCRIPTION OF THE PREFERRED EMBODIMENTS

The following description is presented to enable any person skilled in the art to make and use a computer implemented system and method and apparatus to perform substrate noise analysis in accordance with embodiments of the invention, and is provided in the context of particular applications and their requirements. Various modifications to the preferred embodiments will be readily apparent to those skilled in the art, and the generic principles defined herein may be applied to other embodiments and applications without departing from the spirit and scope of the invention. Moreover, in the following description, numerous details are set forth for the purpose of explanation. However, one of ordinary skill in the art will realize that the invention might be practiced without the use of these specific details. In other instances, well-known structures and processes are shown in block diagram form in order not to obscure the description of the invention with unnecessary detail. Thus, the present invention is not intended to be limited to the embodiments shown, but is to be accorded the widest scope consistent with the principles and features disclosed herein.

Overview

Figure 1:
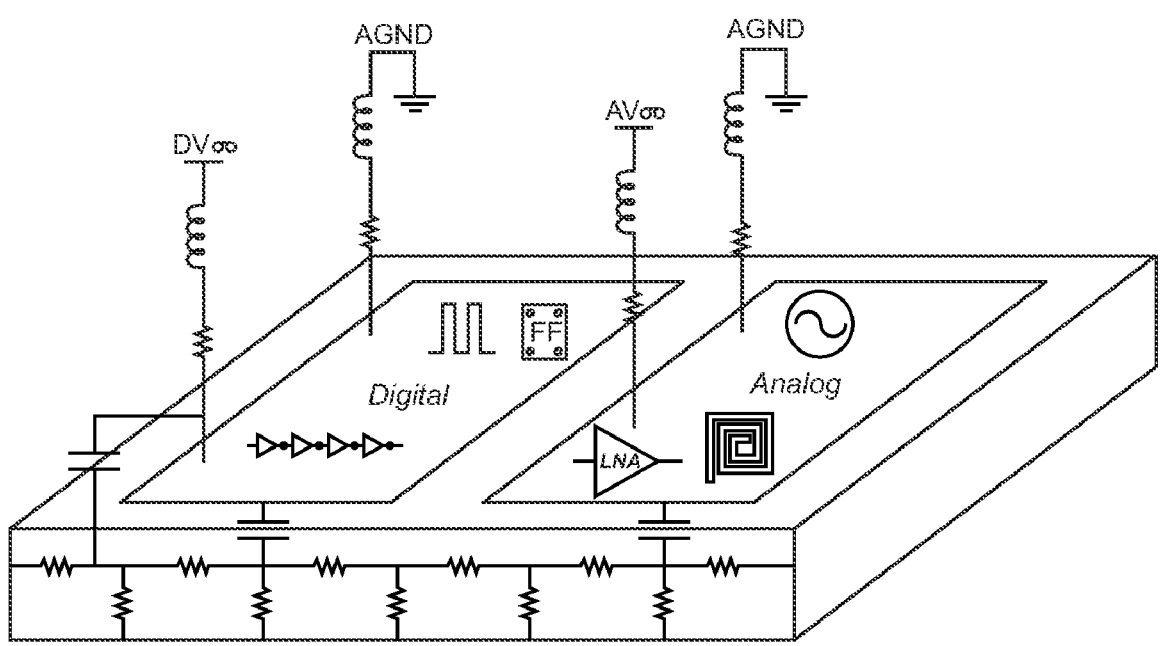
FIG. 1 is an illustrative perspective view of a mixed-signal integrated circuit that includes a digital subsystem and an analog subsystem and that shows a cross-section view of the IC substrate.
Figure 2:
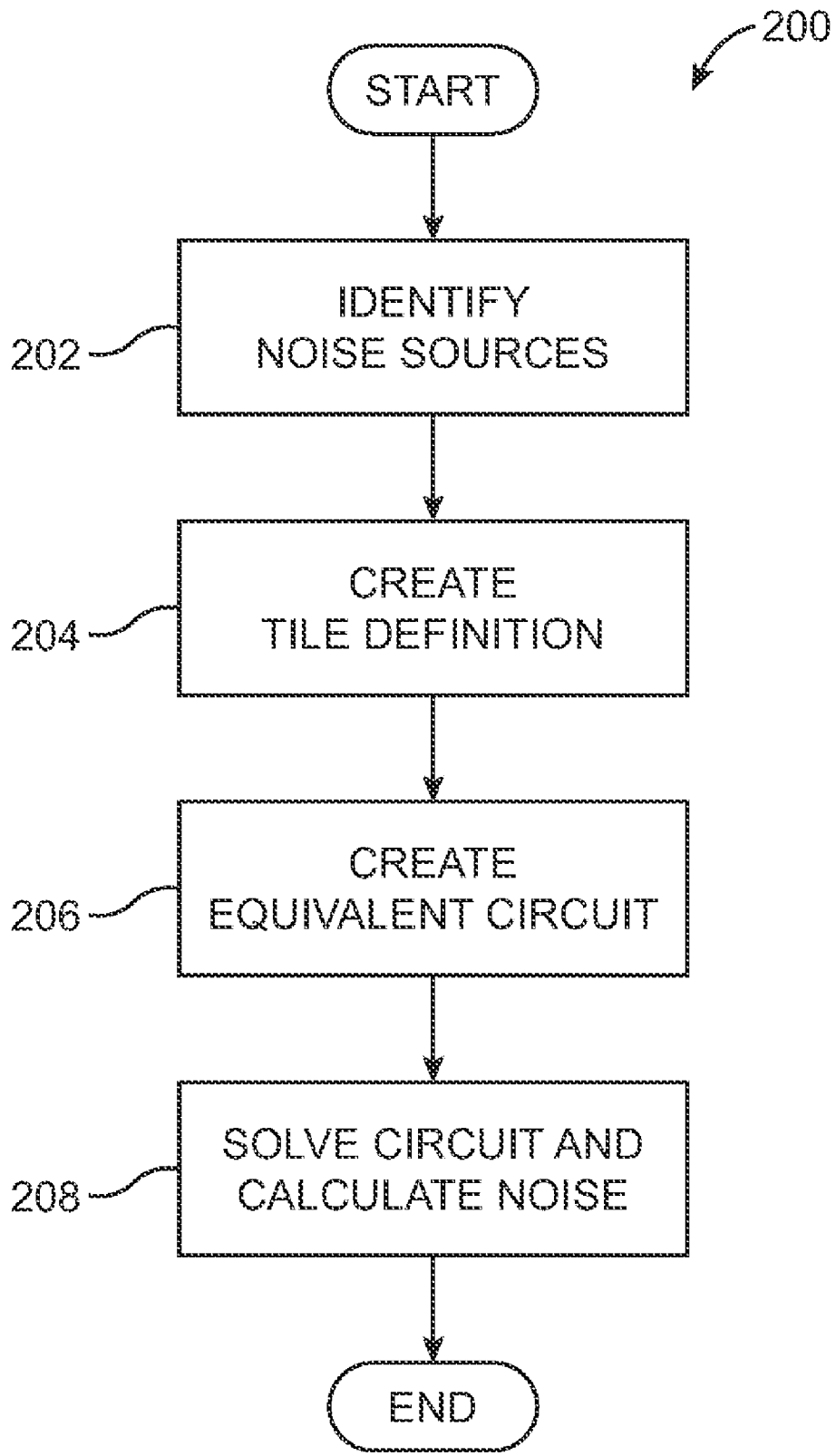
FIG. 2 is an illustrative flow diagram of a computer implemented process to estimate substrate noise in an integrated circuit in accordance with some embodiments of the invention.

FIG. 2 is an illustrative flow diagram 200 of a process to estimate substrate noise in an integrated circuit in accordance with some embodiments of the invention. In block 202, substrate noise injection sources are identified. In some embodiments, the substrate noise injection sources are identified from waveform files produced by a dynamic power grid analysis (DPGA) process. Circuit elements, such as individual gates or combinations of gates typically are represented in a design as cells from a cell library. There may be many instances of an individual cell throughout a design. More complex circuit elements such as adders or storage units may be represented in a design as macros. There may be many instances of an individual macro throughout a design. Each active circuit element, whether it is a cell or a macro, is associated with one or more electrical contacts coupled to a power grid that reaches throughout the IC. The DPGA process associates voltage waveforms representing digital switching induced power grid fluctuations with electrical contacts that are physically distributed throughout the IC. In general, the power grid includes both a $V_{DD}$ network and a Ground network, and each cell has an electrical contacts connected to the $V_{DD}$ network and also has an electrical contacted connected to the Ground network.

In block 204, one or more tile definitions are provided that represents electrical behavior of representative portions of the IC substrate. A tile definition specifies an electrical model associated with instances of the tile and specifies physical dimension information that is indicative of area encompassed by instances of the tile. Different tile definitions may be produced for different portions of the substrate that have different physical characteristics and correspondingly different electrical behaviors. For example, a tile definition and a corresponding electrical model may be produced to represent a small representative portion of the bulk region of the substrate. A different tile definition and a corresponding electrical model may be produced to represent a small representative portion of a well-region of the substrate. Still another different tile definition and a corresponding electrical model may be produced to represent a small representative portion of a guard ring region of the substrate.

Each of the different tile definitions provided in block 204 may specify the same physical dimension information although dimensions may differ from one tile definition to the next. In some embodiments, physical dimension information includes shape information and size information. The shape information indicates the shape of the tile, e.g. rectangular or triangular. The size information indicates size of the tile. For instance, size may be specified as the length of one or more sides of a rectangular shape tile or the length of base and height of a triangular shape tile. Together, the shape and size information of a given tile definition determine an area encompassed by a tile instance defined by the tile definition.

In block 206, a tile grid is produced that forms an equivalent circuit that models overall electrical behavior of the substrate. Tile instances are mapped to substrate locations that have physical characteristics modeled by the electrical model specified for the tile instance. Tile instances mapped in this manner are connected together to produce the tile grid. In block 208, the equivalent circuit is solved using a numeric solver to calculate noise propagated to one or more locations within the substrate as a result of the injected substrate noise. This can be solved using any linear circuit solver or a more general linear circuit simulator, such as the Spectre™ circuit simulator product from Cadence Design Systems, Inc.

FIG. 3A is an illustrative drawing of an example tile grid in accordance with some embodiments of the invention. Three types of tile instances are included in the example tile grid. A first tile instance type labeled 'blk1' is associated with an electrical model that models the electrical behavior of a first representative bulk portion of the substrate. A second tile instance type labeled 'blk2' is associated with an electrical model that models electrical behavior of a second representative bulk portion of the substrate. A third tile instance type labeled 'grd' is associated with an electrical model that models behavior of a representative guard region of the substrate. All tiles in the illustrative grid are rectangular in shape. Each respective tile instances in the tile grid is mapped to a respective substrate location that has physical characteristics that match those of the representative portion modeled by the electrical model associated with the respective tile instance mapped to that respective location. Tile locations are labeled 1-38 in the illustrative drawing of FIG. 3A. Thus, each 'blk1' type tile instance is mapped to a substrate location (i.e., 6, 7, 10, 11, 14, 15, 18, 19) that has first bulk substrate characteristics. Each 'blk2' type tile instance is mapped to a substrate location (i.e., 25-38) that has second bulk substrate characteristics. Each 'grd' type tile instance is mapped to a substrate location (i.e., 1-4, 5, 8, 9, 12, 13, 16, 17 and 20-24) that has substrate guard ring characteristics.

Tile grid instance locations (1-24) are adjacent to an analog circuit block; analog circuitry is formed in the IC surface over these substrate locations. Tile grid instance locations (25-38) are adjacent to one or more digital circuit blocks; digital circuitry is formed in the IC surface over these substrate locations. In this example, tile instances representing substrate characteristics under different regions of the digital circuitry have different physical dimensions. In particular, tile instances representing substrate locations that are closer to or within the analog block (i.e. locations 1-24) are smaller in size than tile instances representing substrate locations under a digital block farther from the analog block (i.e. locations 25-38). A smaller size tile allows closer, more detailed, observation of areas where the noise is likely to be higher or is likely to have a greater impact upon circuit performance.

Thus, in this example, tiles nearby the analog region are smaller since noise has a greater impact upon analog circuit performance.

Figure 3B:
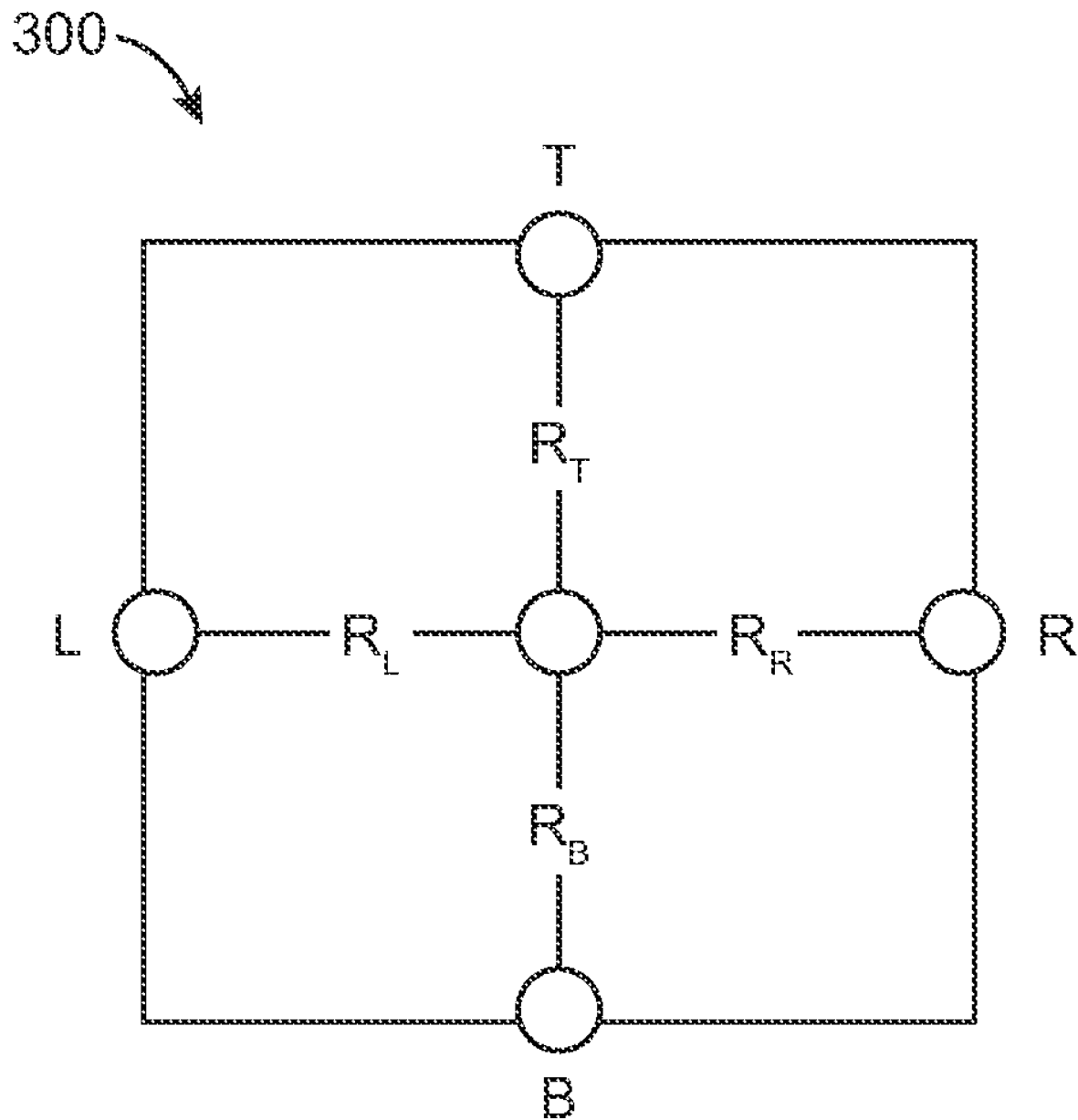

FIG. 3B is an illustrative drawing representing a tile instance definition 300 that specifies an electrical model and physical dimension information for tile instances in accordance with some embodiments of the invention. Accordingly, the tile definition is representative of tile instances defined by the definition. Each instance in accordance with the definition includes an electrical model that includes resistors R.sub.T, R.sub.R, R.sub.B and R.sub.L. The electrical model also includes connection nodes T, R, B and L and a centrally disposed connection node 302 at the junction of the resistors. Each of the nodes can be used to inject noise to the tile for propagation within a tile grid representing the substrate or to 'observe' noise propagated to the node's location in a tile in a tile grid representing the substrate. The resistors represent the noise propagation behavior of a portion of the substrate represented by instances of the tile. The connection nodes can be coupled to complementary connection nodes of adjacent tiles (not shown) to form a tile instance in a tile grid, such as that shown in FIG. 3A, representing overall noise propagation behavior of the substrate. For example, the T (top) node can be connected to a B node (not shown) of another tile (not shown) disposed above the tile instance 300 in a tile grid. The R (right) node can be connected to a L (left) node (not shown) of another tile (not shown) disposed to the right of the tile 300 in a tile grid. The B (bottom) node can be connected to a T node (not shown) of another tile (not shown) disposed below the tile instance 300 in a tile grid. The L (left) node can be connected to an R (right) node (not shown) of another tile (not shown) disposed to the left of the tile instance 300 in a tile grid.

The tile instance definition 300 also specifies physical information. The tile definition specifies a rectangular shape. A size dimension also is specified by the lengths of the sides of the rectangular shape. The shape and size of the tile definition determine the area encompassed by tile instances defined by the tile definition. The tile definition 300 is encoded in computer readable code in a computer memory.

In general, the center connection node 302 is used as a noise injection node or noise observation node. For example, in some applications an objective is to assess the possible impact of substrate noise injected by digital circuit switching upon analog circuit performance. In those applications, a tile instance represented by the tile definition that is mapped to a substrate location adjacent digital circuitry is likely to be used as a noise injection node, and a tile instance mapped to a location adjacent analog circuitry is more likely to be used as a noise observation node. Additionally, each of nodes T, R, B or L also can serve as either injection or observation nodes.

Moreover, alternate tile definitions may be employed that specify different networks of resistors, different combinations of connection nodes or that also include capacitance and/or inductance values. Basically, different tile macro models can be developed to represent to model the electrical behavior of different representative portions of the substrate. Also, non-rectangular tiling schemes are possible, although more complex to implement. For example, one can create a triangle based meshes to represent a substrate. Thus, it will be understood that the tile 300 of FIG. 3 is just one illustrative example tile.

Referring again to FIG. 2, in block 206 the tile instance 300 is coupled within a tile grid such as that shown in FIG. 3A so that its geometric location within the tile grid corresponds to a physical location of one or more sources of substrate noise. Once coupled within such a tile grid, the tile instance 300 can be used in block 208, for example, to model propagation of injected noise from central noise injection node 302 through resistors $R_T$, $R_R$, $R_B$ and $R_L$ to respective nodes T, R, B and L and then to adjacent tiles (not shown) connected above, to the right, below, and to the left of the tile instance 300. Also in block 208, for example, the tile instance 300 can be used to model the propagation of noise from another tile (not shown) to the right from the R node through resistors $R_R$ and $R_L$ to the L node and on to another tile (not shown) to the left of the tile instance 300; through resistors $R_R$ and $R_B$ to the B node and on to another tile (not shown) below the tile instance 300; through resistors $R_R$ and $R_T$ to the T node and on to another tile (not shown) above the tile instance 300. Thus, collectively, the tile instances of a tile grid, which may comprise a multiplicity of tile instances like that of FIG. 3B as well as other types of tiles (not shown), can be used to model propagation of noise injected at one or more physical locations in the substrate to other locations throughout the substrate.

Creation of Substrate Model and Tile Grid

Figure 4:
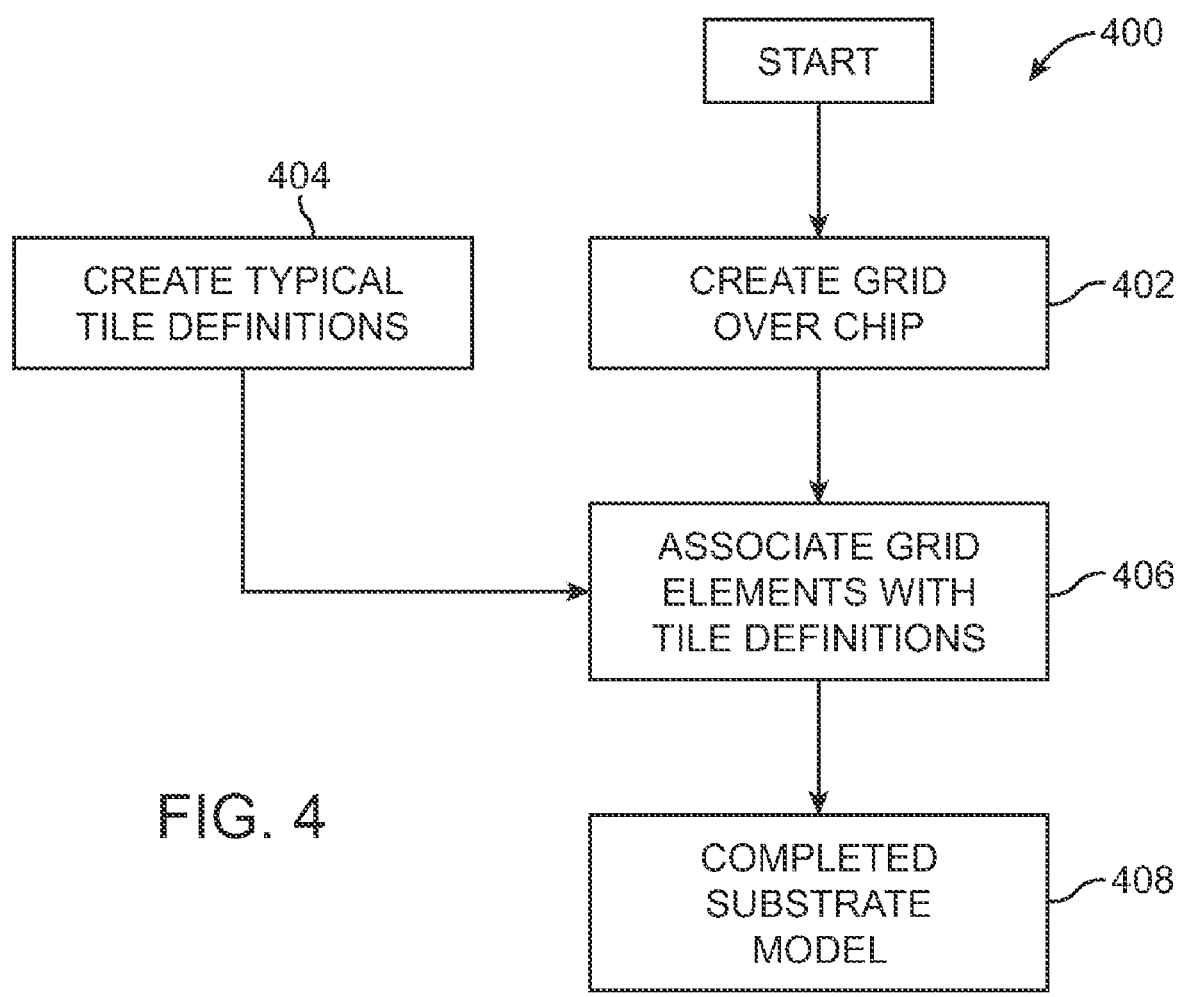
FIG. 4 is an illustrative flow diagram of a computer implemented substrate model creation process in accordance with some embodiments of the invention.

FIG. 4 is an illustrative flow diagram of a substrate model creation process 400 in accordance with some embodiments of the invention in which a substrate model is created that is encoded in computer readable storage. In block 402, a tile grid is defined in relation to the IC. The tile grid definition demarcates the physical substrate locations corresponding to individual tile locations as well as the physical positions of tile locations relative to each other. In block 404, tile definitions are selected that model the electrical behavior of portions of the substrate. One or more types of tile instances, such a tile instance as defined in the illustrative drawing of FIG. 3B, are used to represent electrical characteristics of the substrate. Tile instance definitions are store in computer readable storage. The substrate instance electrical models of the grid are connected so as to model the propagation of substrate noise throughout an IC substrate. By 'connected', it is meant that associations are created in computer readable memory between tile instances so as to define noise signal paths between tiles.

Different locations of an integrated circuit substrate may have different electrical characteristics. The electrical characteristics of the substrate may be influenced by a buried oxide layer in an SOI device or the presence of an epitaxial layer, for example. Locations of a substrate that have guard rings or n-wells or p-wells may have distinct electrical characteristics. Therefore, different substrate models may be created to represent substrate locations having different physical features that have different electrical characteristics.

The different electrical models associated with different tile definition may be created using an automated extractor tool, which extracts from an IC design a mathematical representation of the electrical behavior of a representative portion of the substrate. Alternatively, mathematical substrate models may be produced manually based upon the expertise of a skilled process engineer. In either case, individual substrate models can be used to predict the propagation of substrate noise through a region of the substrate having characteristics modeled by such individual models. As yet another alternative, a library of tiles may be provided from which to select tiles to be associated with different substrate grid locations.

In block 406, tile instances defined in block 404 are mapped to tile grid locations defined in block 402. The mappings are made based upon characteristics of the substrate at different tile grid locations. For example, instances of a tile model representing electrical behavior of a representative portion of the bulk substrate are mapped to grid locations corresponding to bulk substrate regions of the substrate. Likewise, for example, instances of a tile model representing electrical behavior of a representative guard ring portion of the substrate are mapped to grid locations corresponding to guard ring regions of the substrate.

In block 408, a completed substrate model is outputted that comprises individual electrical models for a plurality of tile instances connected together to represent overall electrical behavior of the substrate, or to at least represent the electrical behavior of a portion of the substrate to which the tile grid is mapped. Individual tile instance electrical models model the electrical behavior of the substrate regions corresponding to associated grid locations to which they are mapped. Thus, an overall substrate model is developed using tiles without the need to perform an expensive extraction process across each location of the IC substrate.

Figure 5:
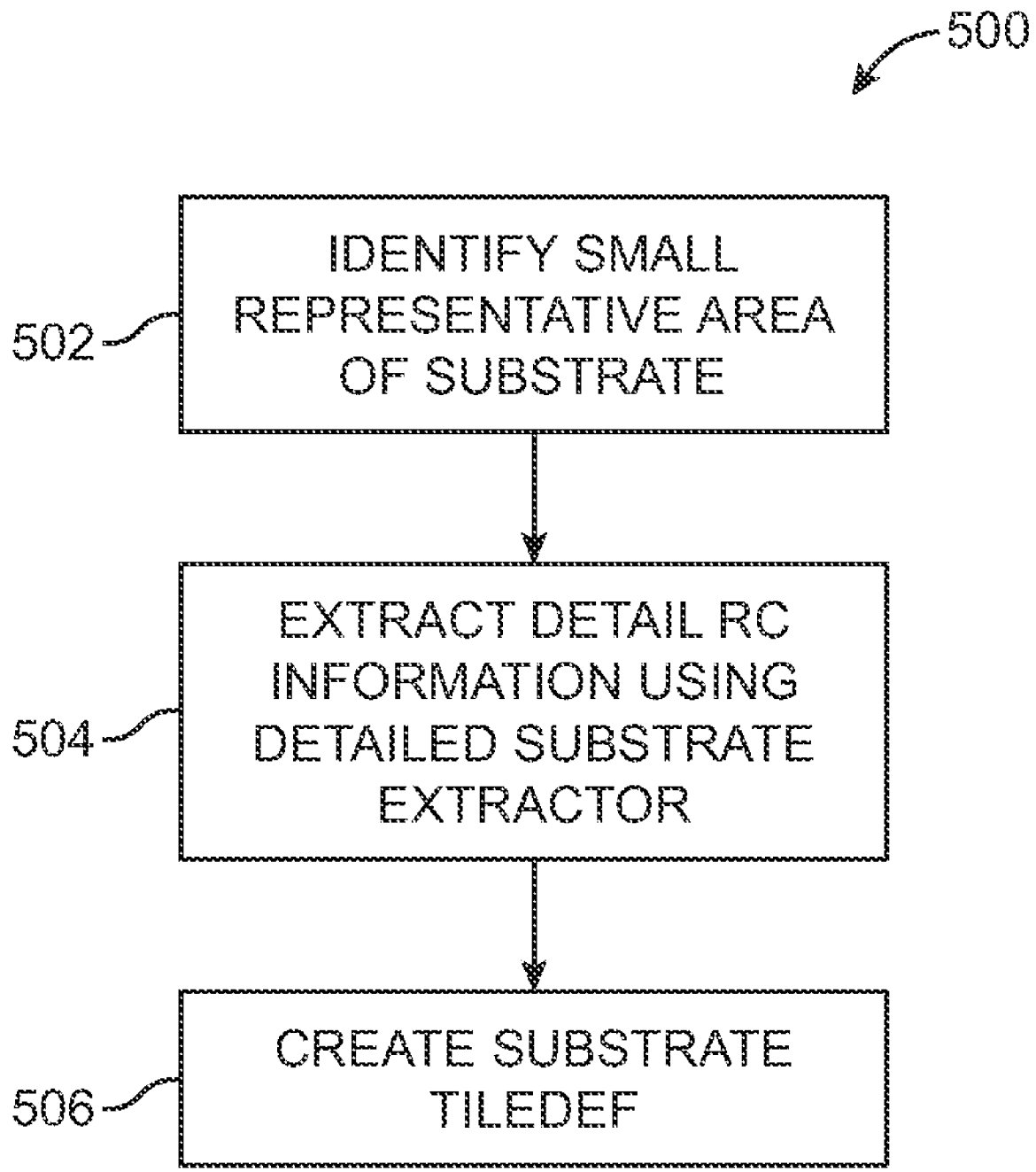
FIG. 5 is an illustrative flow diagram of a computer implemented method for creating tile model definitions in accordance with some embodiments of the invention.

FIG. 5 is an illustrative flow diagram of a method 500 to create tile model definitions in accordance with some embodiments of the invention. In block 502, small representative areas of the substrate that have distinct electrical characteristics are identified, such as, bulk substrate, guard ring and well regions. In block 504, an extractor process extracts detailed RC information concerning the identified representative areas. An extractor is a software tool used to analyze a shape based representation of an integrated circuit or portion thereof. An extractor typically uses models of an electromagnetic or electrostatic wave equation solution to represent those shapes, and converts that into an equivalent electrical network comprised of parasitic elements such as resistances, capacitances and inductances. In other words, "parasitic extraction" is the process of creating an equivalent electrical representation of a layout. In block 506, a substrate tile definition is created for each representative area using the extracted RC information. FIG. 3B is an illustration of one example tile definition.

Figure 6:
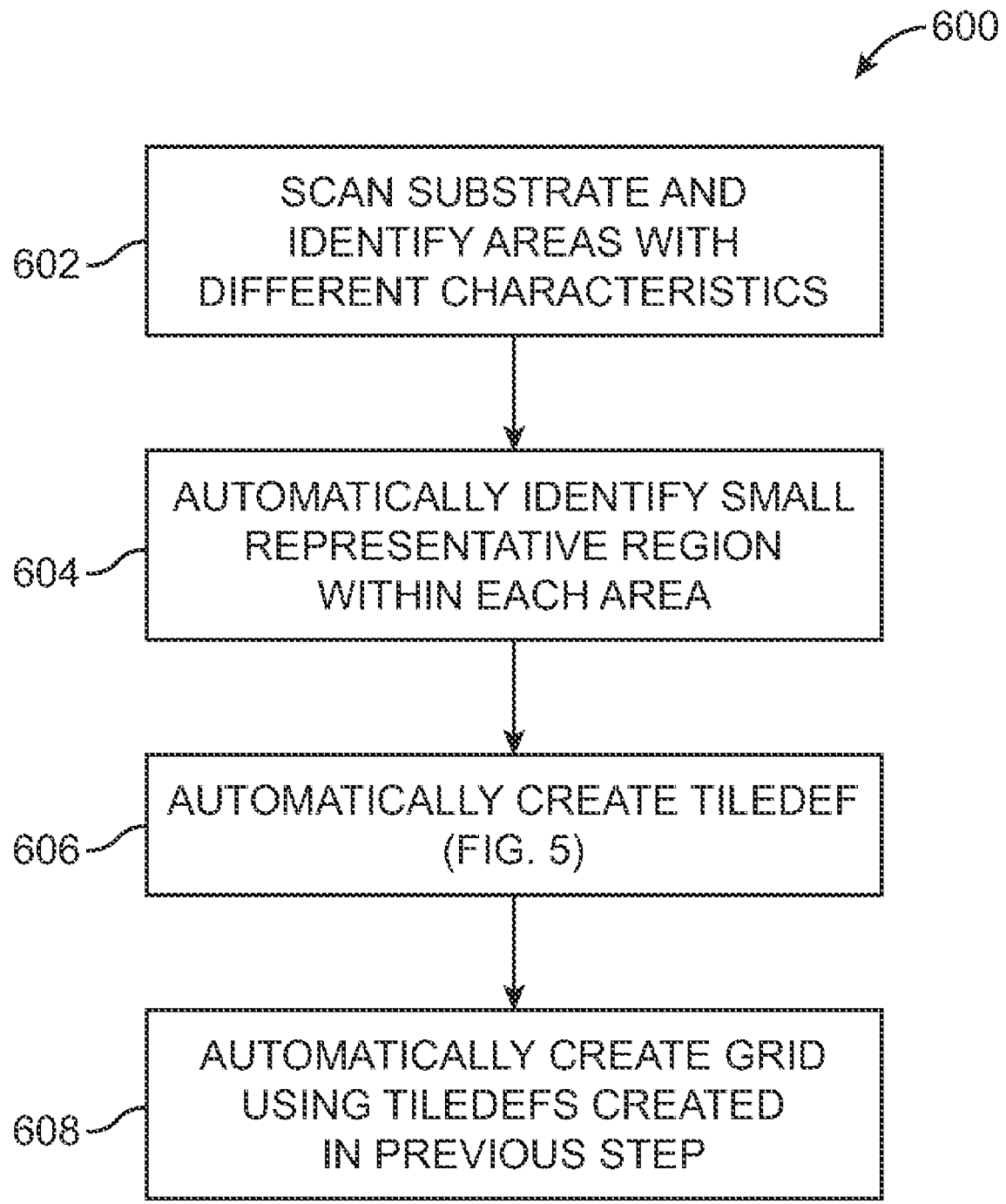
FIG. 6 is an alternative computer implemented process to create a tile grid in accordance with some embodiments of the invention.

FIG. 6 is an alternative process 600 to create a tile definition in accordance with some embodiments of the invention. In block 602, the IC substrate is scanned to identify regions having different electrical characteristics such as, bulk substrate, guard rings, and wells. In block 604, small portions within each identified region are identified that have electrical characteristics representative of physical characteristics that recur at many different locations of the substrate. In block 606, for each such small portion, a tile model definition is created pursuant to the process described with reference to FIG. 5. In block 608, a tile grid array is created using the tiles models defined in block 606. Thus, as in the process described with reference to FIG. 4, a substrate model is produced in which tile models are associated with substrate grid locations having electrical characteristics represented by the associated models.

Identification of Noise Sources and Creation of Representative Noise Source

Figure 7:
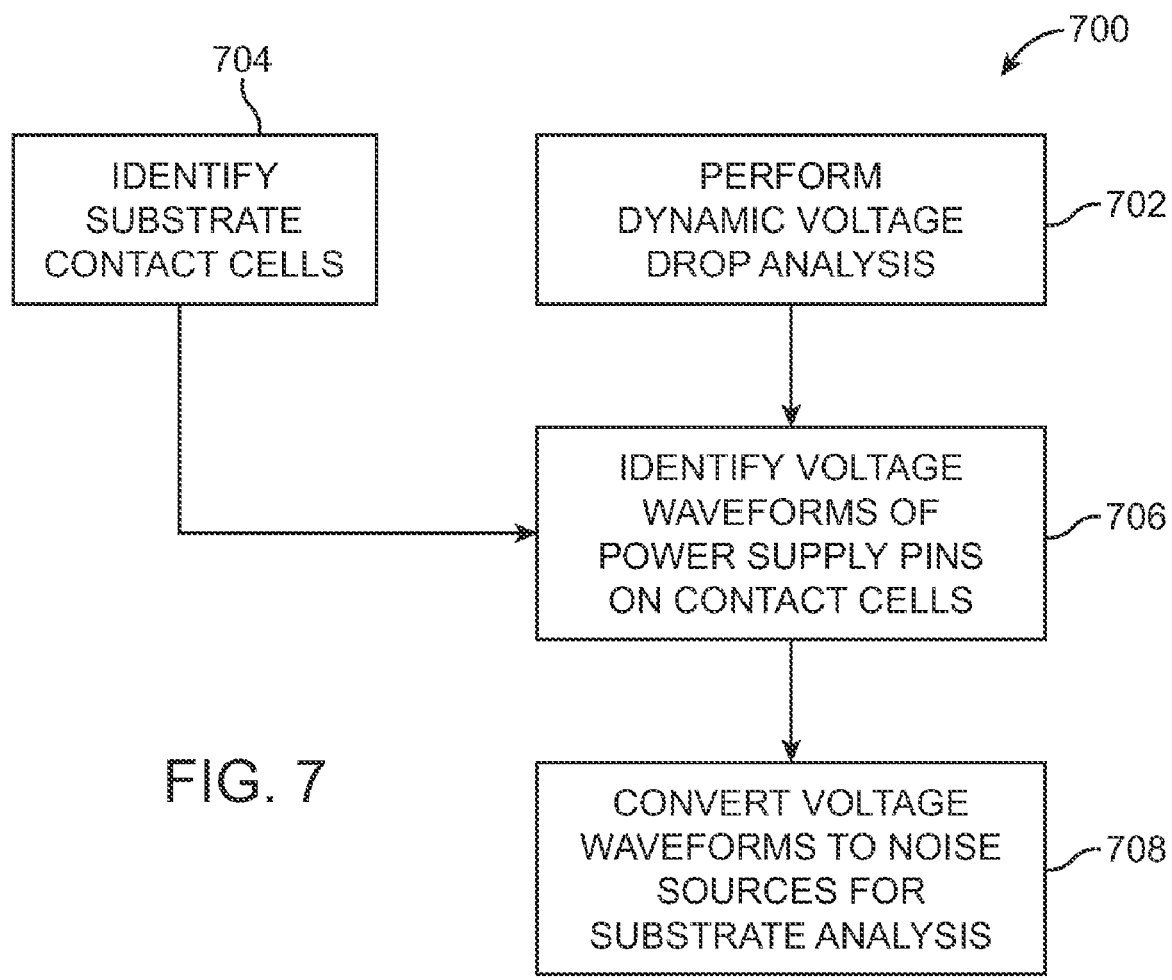
FIG. 7 is an illustrative flow diagram of a computer implemented noise source identification process in accordance with some embodiments of the invention.

FIG. 7 is an illustrative flow diagram of a noise source identification process 700 in accordance with some embodiments of the invention. In block 702, a dynamic voltage drop analysis (DPGA) process is performed. In block 704, circuit element contacts are identified. In block 706, voltage waveforms are identified that are produced by the voltage drop analysis and that are associated with power supply contacts of cells in the IC. In block 708, the identified voltage waveforms are associated with connection nodes of tile instances in a tile grid. The association of the voltage waveforms with the tile grid thereby models noise injection to the substrate.

Figure 8:
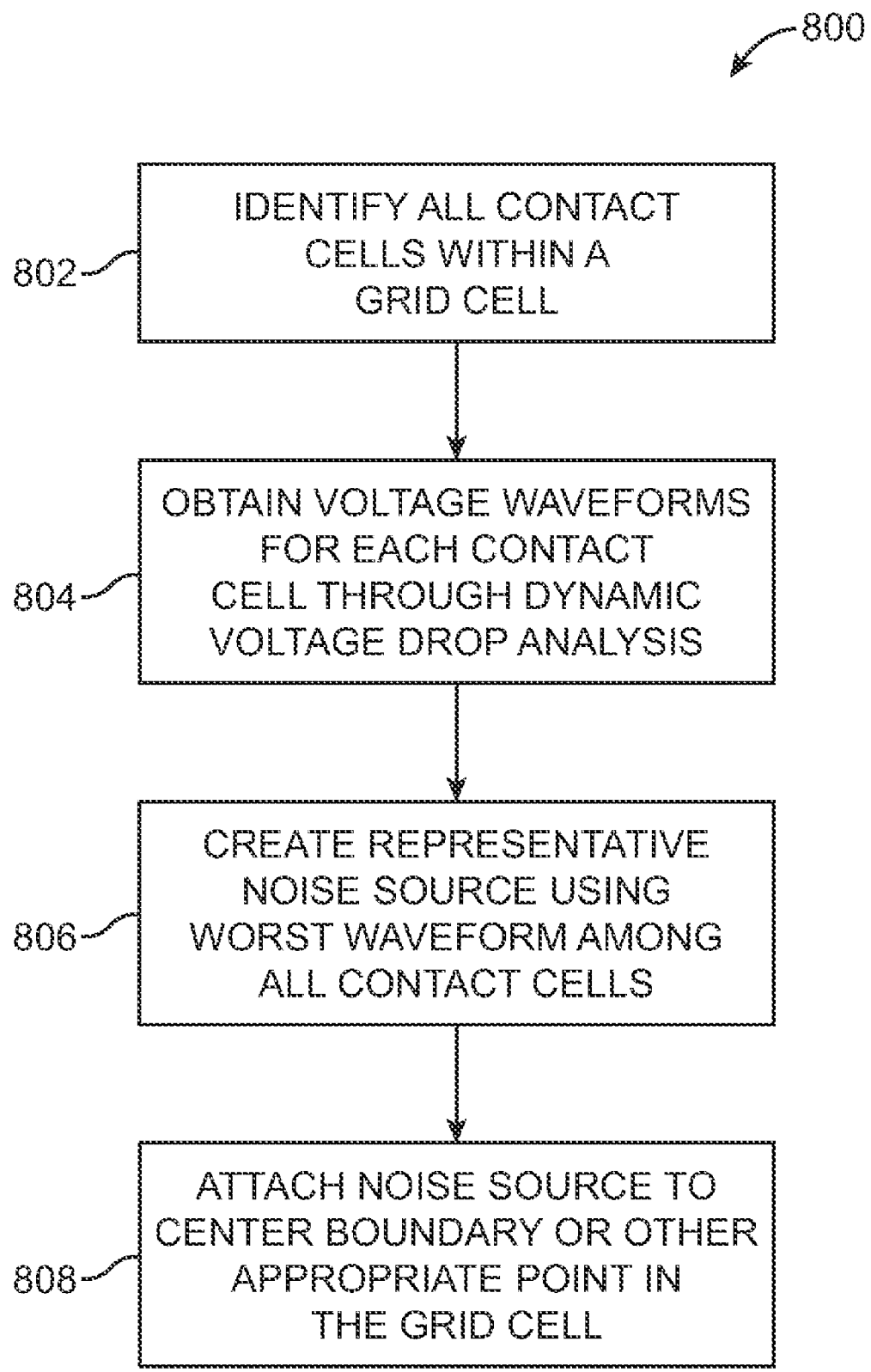
FIG. 8 is an illustrative flow diagram of a computer implemented process to create a representative noise source from multiple individual noise sources in accordance with some embodiments of the invention.

FIG. 8 is an illustrative flow diagram of a process to create a representative noise source from multiple individual noise sources in accordance with some embodiments of the invention. In block 802, contacts are identified within each grid location defined in the process of FIG. 4 or FIG. 6. In other words, for each grid location, each contact within such grid element is identified. It will be understood that multiple cell instances may be encompassed by the physical area dimension of a given tile instance at a grid location, and each encompassed cell may have two or more contacts (e.g. one or more substrate contacts and one or more well contacts per cell). Both substrate and well contacts are identified. In block 804, voltage waveforms associated with identified contacts are determined through a dynamic voltage drop analysis process. In block 806, for each tile grid location, one or more representative voltages are determined to represent the voltage waveforms associated with the multiple contacts encompassed by the tile instance mapped to that location. In some embodiments, a single worst case voltage from among all voltage waveforms identified for the grid location is selected as the representative voltage. The representative voltage serves as a representative noise source for that grid element. For example, the worst case voltage waveform from among multiple waveforms can be selected as the waveform with the highest peak voltage, or the largest RMS voltage, or some other "worst" criterion. In block 808, the noise source identified in block 806 for a grid element is associated with a node of a tile associated with that grid element. For example, assuming that the tile instance of FIG. 3B is associated with a grid, the noise source for that grid element is associated with the connection node 302.

Dynamic Power Grid Analysis

A dynamic power grid analysis (DPGA) process produces waveforms used in substrate noise analysis in some embodiments of the invention. Although DPGA is known to persons having ordinary skill in that art, and itself forms no part of the invention, it is useful to understand the relationship between DPGA and substrate noise analysis in accordance with embodiments of the invention, to better appreciate the invention. The following section on DPGA is provided to explain that relationship.

Figure 9B:
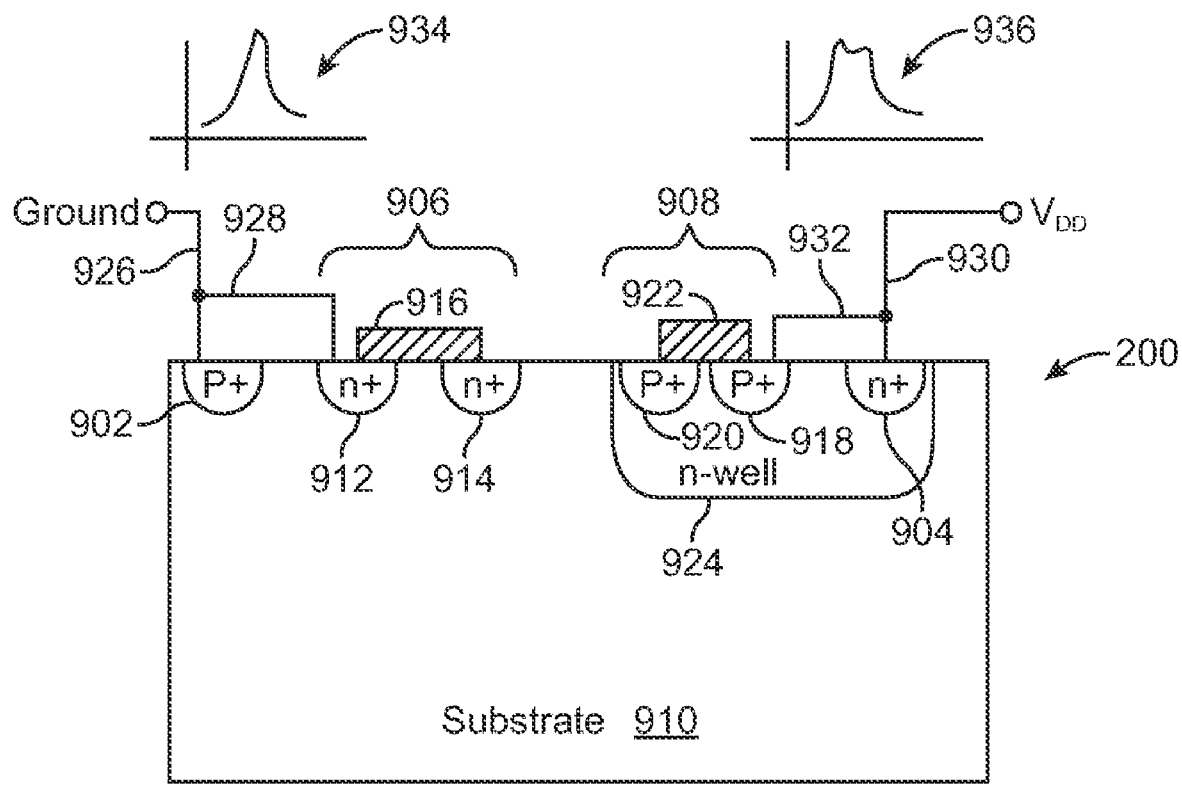
FIG. 9A is an illustrative drawing of an example gate cell instance from a typical cell library and an illustrative cross-section view of an NMOS transistor (FIG. 9A) and a PMOS transistor of the example gate cell (FIG. 9B).
Figure 9A:
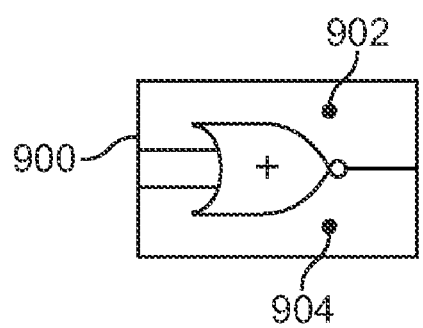

FIG. 9A is an illustrative drawing of an example gate cell instance 900 from a typical cell library. The example gate cell is a NOR gate. The gate cell comprises multiple transistors (not shown) connected to perform a NOR logic function. The example gate cell includes NMOS and PMOS transistors. The gate cell 900 includes a substrate contact 902 and a well contact 904.

FIG. 9B is an illustrative cross-section view of an NMOS transistor 906 and a PMOS transistor 908 of the gate cell 900 of FIG. 9A. The NMOS and PMOS transistors 906, 908 are formed in a substrate 910. The NMOS transistor 906 includes an n+ source 912, an n+ drain, 914 and a gate 916. The PMOS transistor 908 includes p+ source 918, an p+ drain 920 and a gate 922. The PMOS device 908 is disposed in an n-well region 924. The n+ source 912 is coupled to ground potential. In particular, a ground potential wire 926 from a ground potential power distribution network (not shown) is coupled to the bulk substrate 910 through a p+ substrate contact 902. A conductor line 928 interconnects the ground-connected p+ substrate contact 902 with the n+ source 912. The p+ source 918 of the PMOS transistor 908 is coupled to VDD potential. Specifically, a VDD potential wire 930 from a VDD potential power distribution network (not shown) is connected to an n+ well contact 904. A conductor line 932 interconnects the V_DD-connected n+ well contact 904 with the p+ source 918.

Conventionally, waveforms such as waveform 934 and waveform 936 have been produced in the course of a voltage-drop analysis process, sometimes referred to as IR-drop analysis or power grid analysis, which aims to ensure power grid integrity. ICs ordinarily include a power supply distribution network that distributes power to each active cell instance or macro of the chip. The power supply distribution network includes both a $V_{DD}$ potential distribution network and a Ground distribution network. The resistance of interconnects constituting the power distribution network results in a voltage drop across the network, which is commonly referred to as IR drop. During voltage-drop analysis, voltage and/or current waveforms are associated with power and/or ground substrate/well contacts of gate cell instances or macros of an integrated circuit.

The inventors herein have found that these DPGA generated waveforms also can be used to represent noise injection at cell instance substrate/well contacts due to fluctuations in $V_{DD}$ and/or ground power supply attendant to digital circuit switching. According to one aspect of the invention, waveforms developed in the course of dynamic power grid analysis are used as the stimulus waveforms during substrate noise analysis to simulate substrate noise injection due to voltage fluctuations in a power distribution network of a semiconductor integrated circuit (IC).

Thus, in accordance with one aspect of the invention, DPGA generated waveforms associated with the substrate/well contacts of cell instances or macros of an integrated circuit are used to simulate substrate noise injection. The illustrative drawing of FIG. 9B shows an example stimulus voltage waveform 934 associated with the ground-connected p+ substrate contact 902 and also shows a stimulus voltage waveform 936 associated with the $V_{DD}$-connected n+ well contact 904.

As illustrated in FIGS. 9A-9B, each cell instance or macro includes at least one contact disposed on the IC that serves as a physical electrical connection between the functional circuitry of the cell instance and the power supply network. Such contacts provide electrical connection to $V_{DD}$ potential and/or to ground potential used to electrically bias the circuitry of the cell instances or macros of the IC. Also, for example, the substrate may be biased by substrate/well contacts, sometimes referred to as taps, to prevent latch-up. Substrate/well taps may be specified in a standard cell library or supplied by separate well tap cells, which only consist of substrate/well taps for biasing a substrate.

Power grid analysis processes are well known to persons of ordinary skill in the art. In view of the large size of a typical power grid network, simulation of a power grid often has been performed in two steps so as to make the simulation process computationally manageable. Nonlinear devices are first simulated assuming perfect supply voltages, and the currents drawn by the devices (e.g., transistors) are measured. Next, these devices are modeled as independent time-varying current sources to simulate the power grid, and voltage drops at individual devices are measured. Through this two step simulation process, power grid analysis is reduced to solving a large linear network.

Due to signal correlations between circuit blocks of an IC, device circuit currents are interdependent. These correlations often are accounted for during power grid analysis by deriving device circuit currents for individual blocks of the IC from the results of logic simulation using a common set of input patterns. One consideration in power grid analysis is to determine what these input patterns should be. For IR drop analysis, patterns that produce the maximum instantaneous current ordinarily are used.

In the past, power grid analysis often was performed with static, i.e., steady-state, data. In such static analysis, the average current drawn by a cell instance was used. The IR drop over the entire power grid was computed using the average current drawn by each cell. This was sufficient when chips were smaller and operating at lower frequencies. Recently, it has been observed that the variation of the power supply voltage over time is important to control. This has lead to the development of a form of power grid analysis referred to as dynamic power grid analysis (DPGA). In some DPGA embodiments, the currents drawn by different cell instances are modeled as current waveforms. These current waveforms are used during DPGA to calculate the voltage waveforms that exist at specific locations on the power supply grid.

In some embodiments, DPGA involves a determination of the power dissipation by each cell instance of the IC. Since each cell instance can draw a different amount of power depending on its inputs, power analysis can be done either using vectors or some average switching activity. In either case, for DPGA, the power drawn by a cell instance is converted to a current waveform that represents switching of the cell. If the cell instance does not switch for a given set of inputs, then a constant leakage current is determined. If the cell instance switches for a given set of inputs, then a power analysis process determines the current waveform at power grid contacts of such switching cell instance. A static timing analysis is performed prior to DPGA to determine the relative times at which each cell instance may switch. The calculated current waveforms are associated with contacts in the extracted electrical network model. The relative times at which each cell instance may switch is used to position the switching waveforms for each cell instance at the right "global time". The network created above is solved to determine the voltage waveforms at different points in the power grid. This is done using well known linear circuit simulation techniques. A computer aided design tool called, VotageStorm™, produced by Cadence Design Systems, Inc., having a place of business in San Jose, Calif., is one example of one software tool used to perform DPGA.

Voltage-drop analysis can be applied across different IC design stages. These stages are characterized by different models of the power distribution network and of current being drawn by functional blocks. As a design process progresses, models that are more and more accurate can be used for the power grid and block currents. A power grid analysis can be performed early, before a chip floorplan has been designed, post floorplan, after a global power distribution network has been designed and the logic blocks have been placed, or postlayout, after global and block-level grids have been fully designed. For additional information concerning voltage-drop analysis refer to, EDA for IC Implementation, Circuit Design, and Process Technology, Edited by L. Scheffer, L. Lavagno and G. Martin, Chapter 20, Design and Analysis of Power Supply Networks, by D. Blaauw, S. Pant, R. Chaudhry and R. Panda, pages 20-1 to 20-14, CRC Press, 2006, which is expressly incorporated herein by this reference.

Thus, individual voltage waveforms are associated with electrical contacts of cell instances or macros in an IC design. The waveforms are encoded in computer readable medium as is a model of the power grid network having electrical contacts to individual cell instances. The waveforms are indicative of voltage changes in the power grid network at the physical locations in the design at which the contacts are disposed. The inventors have realized that the waveforms also are indicative of localized noise injected to the IC substrate due to power grid fluctuations caused by switching of circuit cell instances.

Digital Noise Model

Digital noise models represent the noise injected to the IC substrate. A digital noise model includes an electrical component and a physical location component. The electrical component comprises a voltage and/or current waveform that represents noise injected to the substrate. A digital noise model can be produced for individual contacts. For an individual contact, the electrical component of a digital noise model comprises an IR-drop waveform associated with that contact. Separate waveforms may be associated for $V_{DD}$ and Ground contacts. The physical location component for an individual contact comprises the location where the noise waveform is injected to the substrate. Specifically, the electrical component of a digital noise model for an electrical contact represents the substrate noise injected through the contact. The physical location component of a digital noise model for an electrical contact comprises physical (x, y) locations of the contacts through which such substrate noise is injected. Digital noise models for contacts may be encoded in computer readable code in a computer storage medium.

For example, an electrical component of a digital noise model corresponding to an individual electrical contact associates one or more waveforms produced by an IR drop analysis such as an DPGA process with the electrical contact. Since such electrical contact has a physical location in an IC, by associating the waveforms with the electrical contact, the digital noise model also associates the waveforms with the physical location of the electrical contact. It will be appreciated that the DPGA process may result in production of different waveforms corresponding to different simulated input signal patterns to an IC. Accordingly, the electrical component of a digital noise model associates different waveforms with the electrical contact depending upon the simulated input signal pattern.

In some embodiments, the electrical component of a digital noise model includes a sub-circuit model used to determine digital noise injection associated with an electrical contact due to a waveform associated with the digital noise model. The sub-circuit model may include magnitude, frequency and phase information of a waveform representing digital noise injection to an electrical contact and also may include values for parasitics (e.g., R, C, L) that affect injection of such digital noise to the substrate. For example, a Thevinin equivalent may be created in which a voltage waveform is connected to a resistance. Such model can be used to represent voltage injection from $V_{DD}$ in where only an AC component of the waveform is taken and the resistance is used to show that it can be attenuated. A more complex representation, for example, may include both a resistor and a capacitor so show that the DC component can be blocked.

Figure 10:
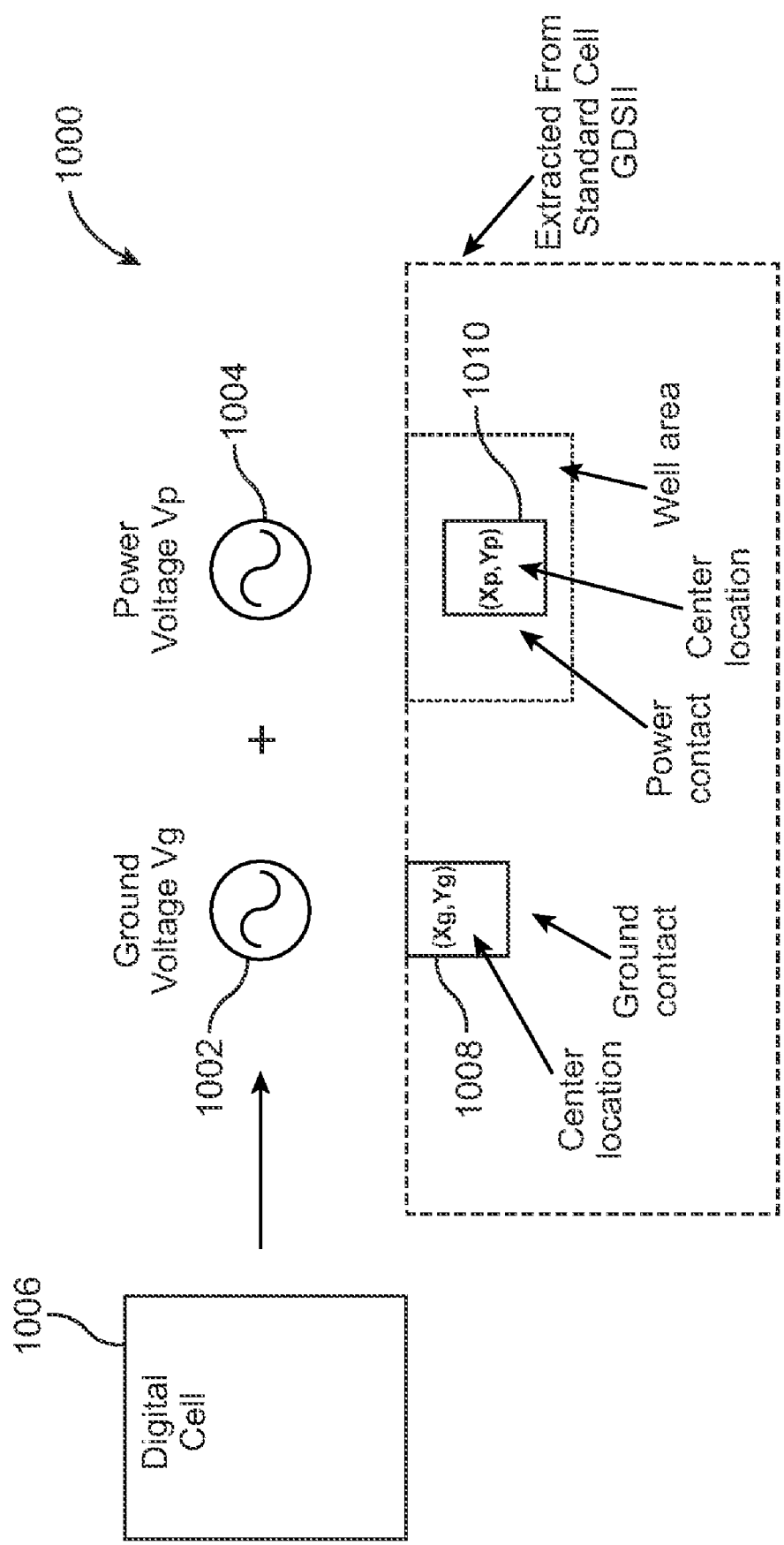
FIG. 10 is an illustrative drawing representing an example digital noise model with voltage sources derived from dynamic IR drop values in accordance with some embodiments of the invention.

FIG. 10 is an illustrative drawing representing an example digital noise model 1000 with voltage sources derived from dynamic IR drop values in accordance with some embodiments of the invention. The digital noise model is associated with a ground and power contacts, 1002, 1004 of a digital cell instance 1006. The ground contact 1002 is coupled in the IC design to a $V_{SS}$/ground network of the power grid, and a power contact 1004 is coupled in the IC design to a $V_{DD}$, network of the power grid. The digital noise model includes a ground contact voltage waveform Vg 1008 derived from a corresponding dynamic IR drop waveform (not shown) produced in the course of a DPGA analysis. The digital noise model also includes a power voltage waveform Vp 1008 derived from a from a corresponding dynamic IR drop waveform (not shown) produced in the course of a DPGA analysis. In some embodiments, Vg and Vp are the worst case voltage waveforms as explained above. The digital noise model includes an indication of a physical (Xg, Yg) location of a center point of the ground contact 1010 and also includes an indication of a center point of a physical (Xp, Yp) location of a center point of power contact 1010.

Figure 11:
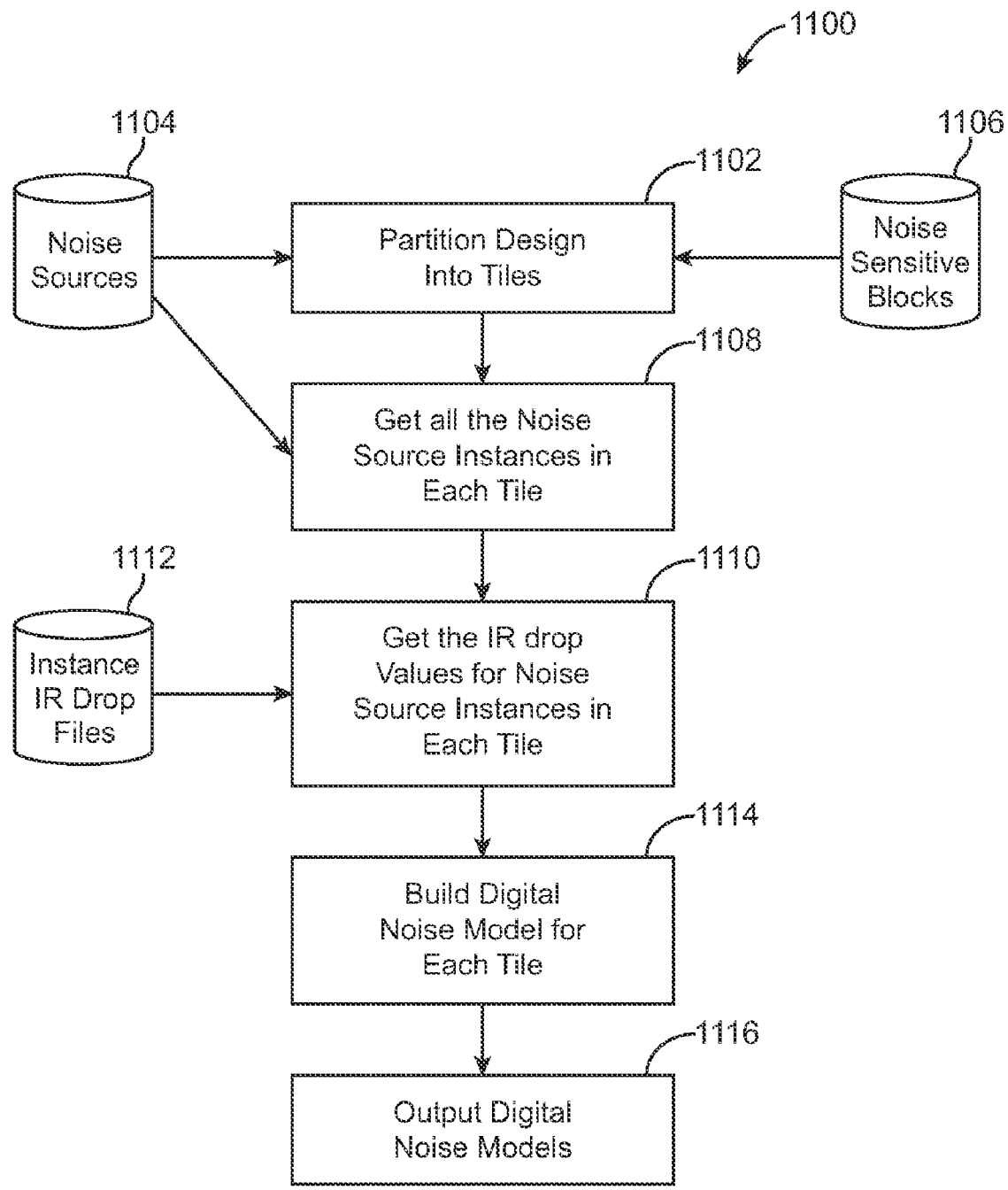
FIG. 11 is an illustrative flow diagram of a computer implemented process to produce digital noise models for a large mixed signal IC design in accordance with some embodiments of the invention.

FIG. 11 is an illustrative flow diagram of a process 1100 to produce digital noise models for a mixed signal IC design in accordance with some embodiments of the invention. In block 1102, a design is partitioned into a tile grid. The partition takes into account noise source locations and noise sensitive block locations. Typically, digital blocks are the prevalent source of substrate noise, and analog blocks are more sensitive to substrate noise. For instance, tile size may depend upon distance of digital circuitry that is a noise source from noise sensitive analog circuitry. Tiles encompassing digital noise sources that are located more distant from noise sensitive circuitry may be larger in area than tiles disposed closer to noise sensitive circuitry. In block 1102, locations of digital noise sources are obtained from storage 1104, and locations of noise sensitive blocks are obtained from storage 1106.

In block 1108, for each tile grid, noise source instances are identified that are encompassed by the tile grid. It will be appreciated of course, that different types of tile instances may be associated with different grid locations depending upon electrical characteristics of the substrate. In block 1100, for each tile, IR drop values are obtained from IR drop storage 1112 for each noise source instance encompassed by the tile. In block 1114, for each tile, an aggregate digital noise model is built as explained below with reference to FIGS. 12A-12B. In block 1116, the digital noise models are output. These digital noise models provide noise source input to an electrical network model comprising tile instances interconnected to produce the tile grid that represents the electrical behavior of the substrate.

A digital noise model can be supplied for digital IP that is considered as a digital noise source. The noise model for a digital IP may contain a list of digital noise models with associated physical locations for noise injection. The electrical part of the digital noise model can be defined in a separate SPICE netlist file with the model names match the voltage sources or in general sub circuit names in SPICE netlist file. In other words, an IP vendor may provide digital noise model information for a for licensed IP for which a designer does not have detailed information.

In general, given a mixed signal design, instance IR drop files are given, noise source cells are specified (default is the whole digital core) including digital IPs with noise model. Also, some sensitive blocks are specified (normally analog blocks). The specified noise sources are used during substrate noise analysis as noise injectors. Observation points are associated with the specified noise sensitive blocks. Thus, a simulation of substrate noise propagation can be performed that specifically simulates the noise impact of selected noise sources upon selected sensitive blocks.

Aggregated Digital Noise Model

A digital noise model may be produced that represents an aggregation of noise contributions from multiple digital noise sources, such as from multiple contacts. For example, an aggregated digital noise model can be produced that represents an aggregation of electrical stimuli (e.g. voltage waveforms) from multiple noise sources encompassed by a given tile instance and/or an aggregation of stimuli physical locations (e.g., electrical contact locations) encompassed by the tile. Aggregation of individual noise sources can reduce the total number of digital noise models to be simulated during simulation of substrate noise propagation with a possible trade-off for accuracy.

Figure 12A:
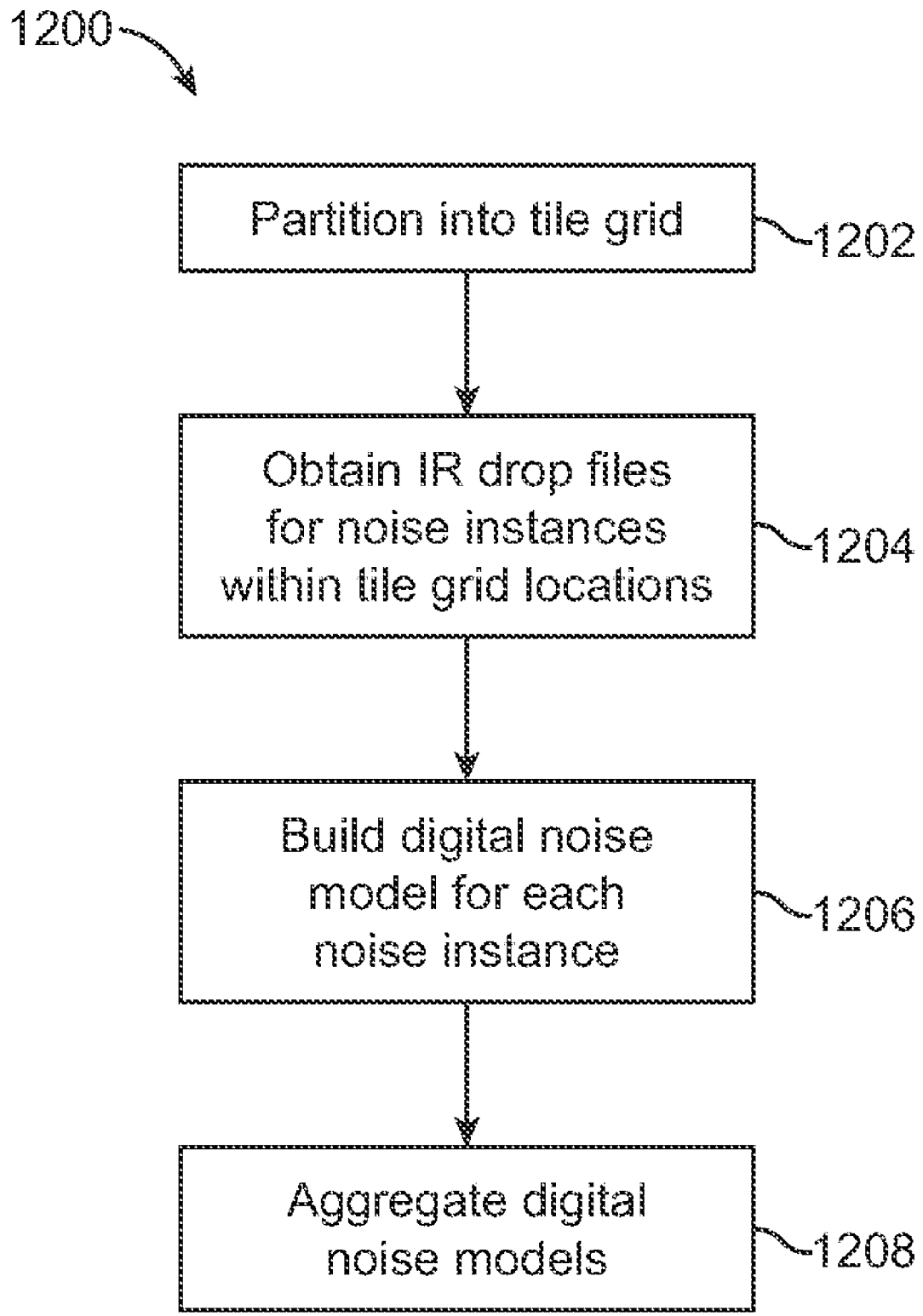
FIGS. 12A-12B are illustrative flow diagrams for a computer implemented process to aggregate digital noise sources in accordance with some embodiments of the invention.
Figure 12B:
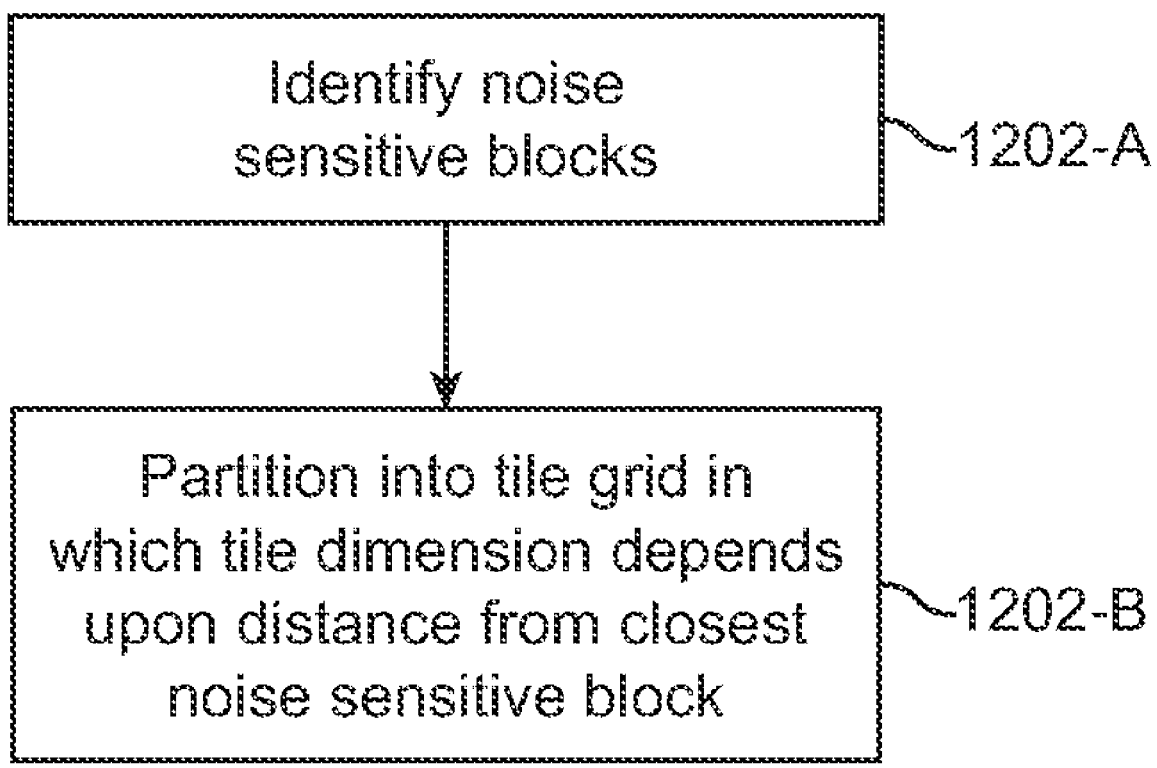

FIGS. 12A-12B are illustrative flow diagrams for a process 1200 to aggregate digital noise sources in accordance with some embodiments of the invention. Referring to FIG. 12A, in block 1200, the design is partitioned into a tile grid. Processes described above with reference to FIGS. 5-6 explain alternative approaches to partitioning a design into a tile grid. A default 50 um×50 um tile grid size can be used, for example. This tile grid size can be adjusted depending upon on the aggregation level as discussed with reference to FIG. 12B. In block 1204, for each tile grid, obtain dynamic IR drop waveforms from an instance IR drop file for all the noise source instances within the tile grid location. In block 1206, as described above, a digital noise model is built (or obtained in the case of IP) for each noise source instance. In block 1208, for each of one or more tile grid locations, individual noise sources encompassed by the tile grid location are aggregated to produce an overall comprehensive model for the tile grid location.

An approach is to select as a noise value for a tile grid, the worst values for power and ground contact noise from among all noise sources encompassed within the tile grid region. This approach results in a single representative noise voltage waveform for an entire tile grid location. In other words, for a given instance of a tile in a tile grid, there is one representative noise source voltage waveform that acts as a noise source corresponding to that tile. The single representative noise source is associated with a connection node of a tile such as center connection node 302 of the example tile 300. Thus, the noise impact of multiple noise sources encompassed by a tile may be represented as one noise source waveform.

Referring to FIG. 12B, there is shown a flow diagram of a more dynamic approach to the tile grid partitioning block 1202 of FIG. 12A. In block 1202A, noise sensitive blocks are identified. In block 1202B, the design is partitioned into a tile grid in which tile instance physical dimensions depend upon distance between noise sources encompassed with tile grid locations and the closest noise sensitive block Tile grid locations that are within a certain range of noise sensitive blocks (e.g., default 50 μm) are smaller. Tile instances that are located outside of that certain range of sensitive blocks can be larger. Alternatively, dimensions of a tile instance can be established based upon noise values associated with the region. For example, tile grid regions with noise source values smaller than some threshold value will be merged into larger tiles.

Substrate Electrical Model Based on Substrate Macro Model and Tile Grid

Figure 13:
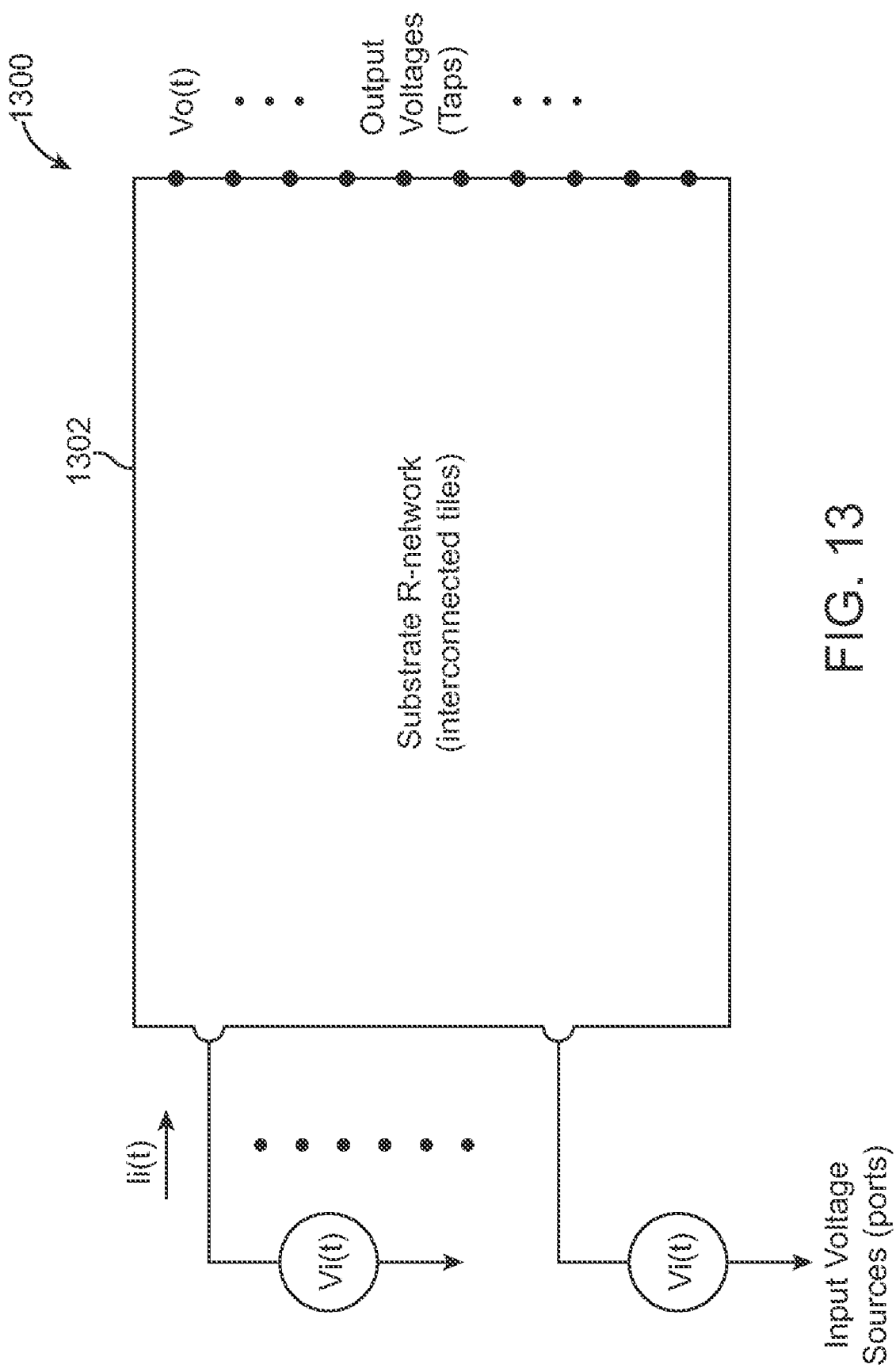
FIG. 13 is an illustrative block diagram of an example substrate analysis electrical model in accordance with some embodiments of the invention.

FIG. 13 is an illustrative block diagram of an example overall substrate model 1300 in accordance with some embodiments of the invention. The overall substrate electrical model 1300 in this example comprises an R-network 1302 produced by interconnection of multiple instances of tiles such as the tile 300 of FIG. 3B, for example. The input voltage values Vi(t) represent substrate noise voltages. For example, for the noise aggregation approach described above, there is one Vi(t) value input per tile. Each noise source has both an associated stimulus value (e.g. waveform) and a physical location. The value Ii(t) represents input current, which is calculated from a substrate analysis process given voltage noise source inputs and an electrical network that represents the substrate. The output voltages Vo(t) represent substrate noise propagated to observation points in the substrate. It will be appreciated that noise values propagated to analog circuit locations are of particular interest.

Figure 14:
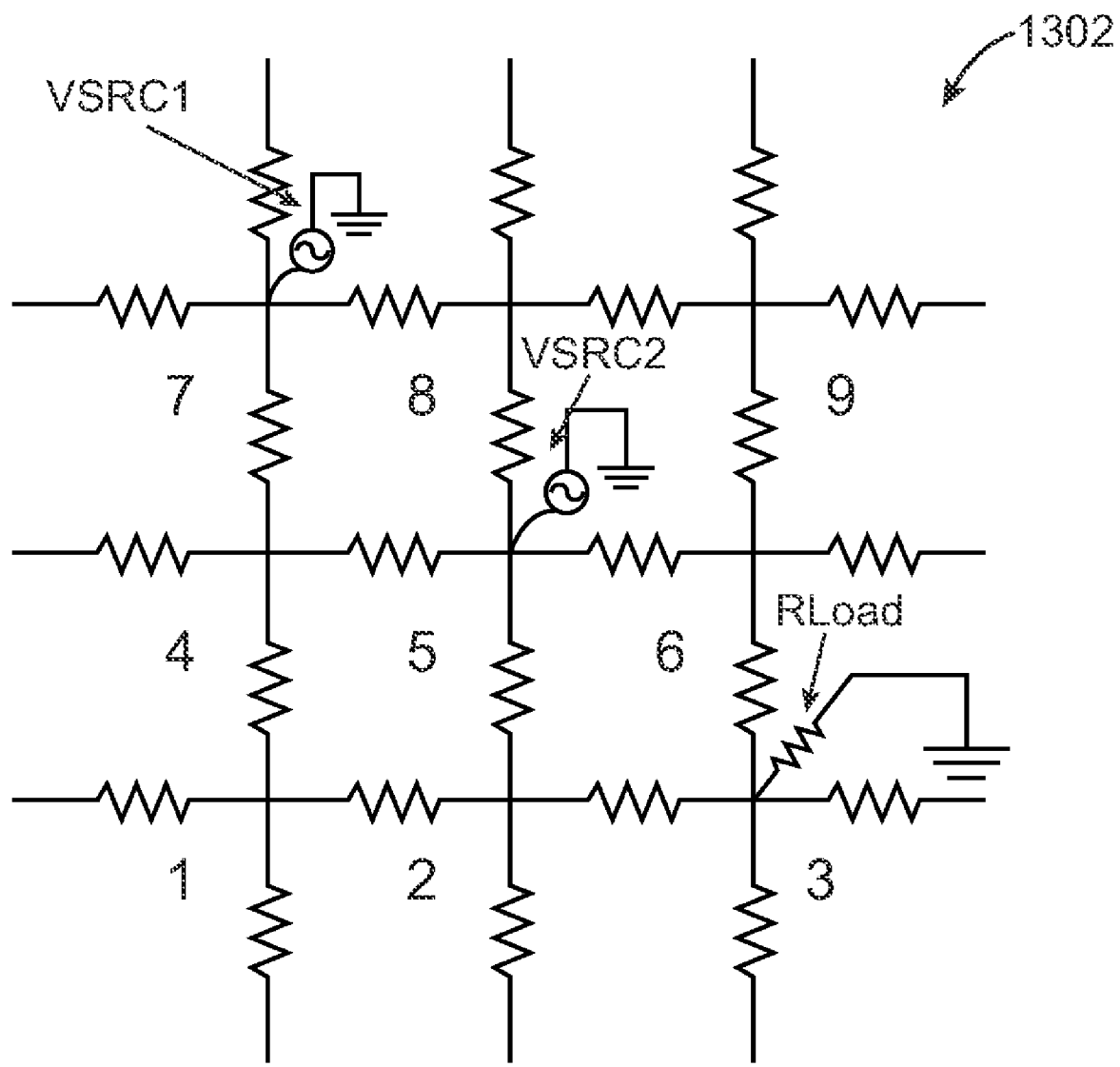
FIG. 14 is an illustrative circuit diagram showing details of the R-network of FIG. 13.

FIG. 14 is an illustrative circuit diagram showing details of the electrical network (resistive) 1302 of FIG. 13. The illustrative drawing shows tile grid locations labeled 1 through 9. Two input voltage sources VSRC1 and VSRC2 are shown attached to digital noise model injection nodes of tile instances mapped to tile grid locations 7 and 5. VSRC1 and VSRC2 in FIG. 14 correspond to two of the Vi(t)'s of FIG. 13. By solving the unknown voltages and currents for this circuit, all unknown voltages and currents can be calculated.

A conductance matrix and current source vector is use to solve the electrical network (resistive) of FIG. 14. To get all the unknown voltage values at the nodes that no voltage sources associated is to solve the following linear equation:

$$GV=I \quad (1)$$

Where G is the conductance matrix with size N×N, N is the number of nodes that have no voltage source associated with. V is the N×1 vector representing the unknown voltage values on the N nodes that need to be solved. The right hand side I is an N×1 vector and containing known current sources at N nodes.

We use the standard stamping method with the following modification to generate G which is always positive definite.

Figure 15:
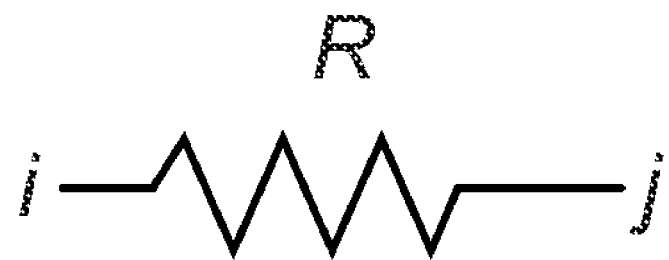
FIG. 15 is an illustrative drawing of a resistor R having two nodes i and j having unknown voltage.

FIG. 15 is an illustrative drawing of a resistor R having two nodes i and j having unknown voltage. The contribution of resistor R to the conductance matrix is calculated in the following way:

$$\begin{array}{c} \phantom{j}\begin{array}{cc} i & j \end{array} \\ \begin{array}{c} i \\ j \end{array}\left( \begin{array}{cc} \frac{1}{R} & \frac{-1}{R} \\ \frac{-1}{R} & \frac{1}{R} \end{array} \right) \end{array} \quad (2)$$

Figure 16:
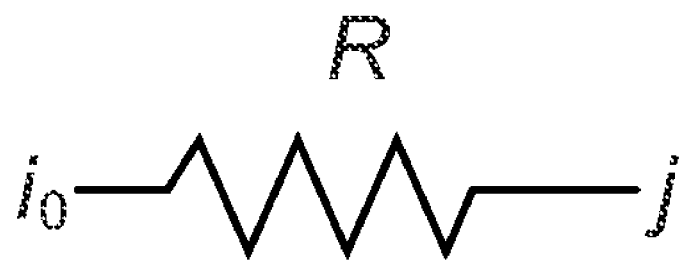
FIG. 16 is an illustrative drawing of a resistor R that has one node having an unknown voltage value $i_0$ and one node having a known voltage value j.

FIG. 16 is an illustrative drawing of a resistor R that has one node having an unknown voltage value $i_0$ and one node having a known voltage value j. For the resistor of FIG. 16 with one node having known voltage value (i.e. attached to a voltage source) the update to the conductance matrix G is done in the following way:

$$\begin{array}{c} \phantom{j}\begin{array}{cc} i_0 & j \end{array} \\ \begin{array}{c} i_0 \\ j \end{array}\left( \begin{array}{c} \frac{1}{R} \end{array} \right) \end{array} \quad (3)$$

Additionally it will also have a component in $i_0$ th row in I vector with the value:

$$i_0\left(\frac{V_{i_0}}{R}\right) \quad (4)$$

There are many known numerical algorithms that can be utilized to solve the linear system in (1). Currently we utilize any of three known methods. The first one is based on LU decomposition. The G matrix is decomposed into two matrixes L and U which are lower triangular and upper triangular in form. This method is not suitable for solving large linear systems since it is slow. The next two methods are taking advantage of the fact that G matrix is positive definite and sparse. They are faster in solving linear system (1) with millions of nodes or unknowns. Specifically the second one is incomplete Cholesky conjugate gradient method normally called ICCG. The third method is based on Gaussian elimination with special indexing for fast performance. For a more detailed discussion on solving large linear systems like (1) see Gene H. Golub and Charles F. Van Loan, "Matrix Computations", Third Edition, 1996, The Johns Hopkins University Press.

Figure 17:
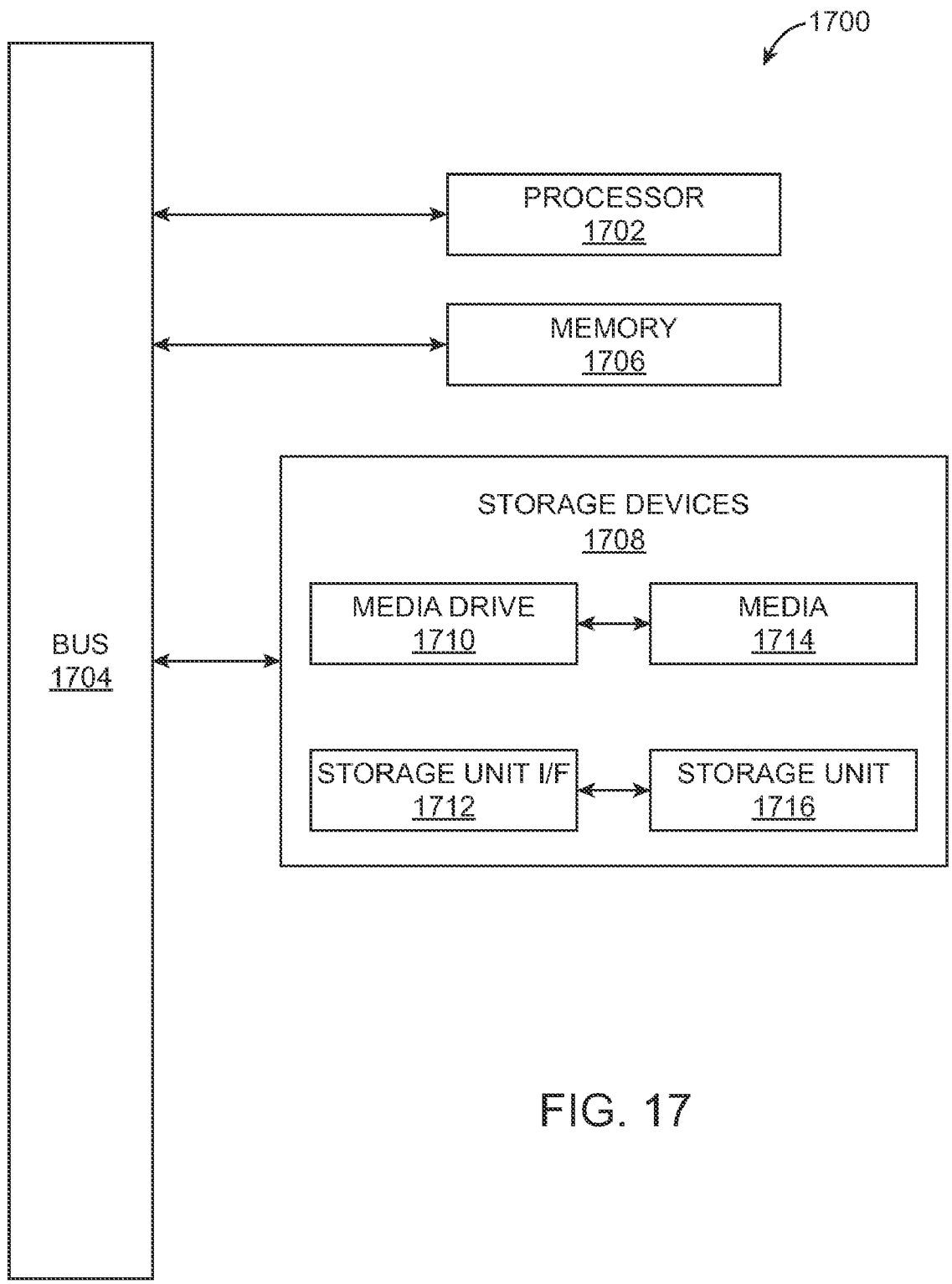
FIG. 17 is an illustrative block level diagram of a computer system that can be programmed to implement processes involved with creation of substrate tile definitions, production of a tile grid, creation of noise models and analysis of substrate noise propagation in accordance with embodiments of the invention.

FIG. 17 is an illustrative block level diagram of a computer system 1700 that can be programmed to implement processes involved with the analysis of noise substrate noise propagation in accordance with embodiments of the invention. Computer system 1700 can include one or more processors, such as a processor 1702. Processor 1702 can be implemented using a general or special purpose processing engine such as, for example, a microprocessor, controller or other control logic. In the example illustrated in FIG. 17, processor 1702 is connected to a bus 1704 or other communication medium.

Computing system 1700 also can include a main memory 1706, preferably random access memory (RAM) or other dynamic memory, for storing information and instructions to be executed by processor 1702. Main memory 2406 also may be used for storing temporary variables or other intermediate information during execution of instructions to be executed by processor 1702. Computer system 2400 can likewise include a read only memory ("ROM") or other static storage device coupled to bus 1704 for storing static information and instructions for processor 1702.

The computer system 1700 can also include information storage mechanism 1708, which can include, for example, a media drive 1710 and a removable storage interface 1712. The media drive 1710 can include a drive or other mechanism to support fixed or removable storage media 1714. For example, a hard disk drive, a floppy disk drive, a magnetic tape drive, an optical disk drive, a CD or DVD drive (R or RW), or other removable or fixed media drive. Storage media 1714, can include, for example, a hard disk, a floppy disk, magnetic tape, optical disk, a CD or DVD, or other fixed or removable medium that is read by and written to by media drive 1710. Information storage mechanism 1708 also may include a removable storage unit 1716 in communication with interface 1712. Examples of such removable storage unit 1716 can include a program cartridge and cartridge interface, a removable memory (for example, a flash memory or other removable memory module). As these examples illustrate, the storage media 1714 can include a computer useable storage medium having stored therein particular computer software or data.

In this document, the terms "computer program medium" and "computer useable medium" are used to generally refer to media such as, for example, memory 1706, storage device 1708, a hard disk installed in hard disk drive 1710. These and other various forms of computer useable media may be involved in carrying one or more sequences of one or more instructions to processor 1702 for execution. Such instructions, generally referred to as "computer program code" (which may be grouped in the form of computer programs or other groupings), when executed, enable the computing system 1700 to perform features or functions of the present invention as discussed herein.

The foregoing description and drawings of preferred embodiments in accordance with the present invention are merely illustrative of the principles of the invention. Various modifications can be made to the embodiments by those skilled in the art without departing from the spirit and scope of the invention, which is defined in the appended claims.

The invention claimed is:

1. A method to produce an electrical model of an integrated circuit substrate comprising:
    providing multiple different tile definitions;
    wherein different tile definitions respectively specify multiple respective connection nodes in which at least one connection node is connectable to propagate noise between such connection node and a connection node of another tile instance and in which at least one connection node is connectable for use as at least one of a noise injection node or as a noise observation node and in which at least two respective connection nodes are electrically connected to propagate noise between them;
    wherein different tile definitions respectively correspond to different portions of the substrate having different physical characteristics;
    wherein different tile definitions respectively specify different electrical models for their different corresponding substrate portions having such different physical characteristics in terms of electrical behavior of noise propagation between the at least two respective connection nodes; and
    wherein different tile definitions respectively specify respective physical dimensions encompassed by the respective tile definitions;
    mapping, using a computer, respective tile instances specified by different tile definitions to respective portions of the substrate that correspond to such respective definitions; and
    connecting respective connection nodes of the mapped tile instances to each other to produce a tile grid to propagate noise between tile instances to model overall electrical behavior of the substrate;
    associating a voltage with a selected tile instance of the tile grid that is indicative of substrate noise injection to the selected tile instance.

2. The method of claim 1 further including:
    using the overall model of substrate behavior represented by the tile grid to compute a voltage associated with a tile instance at a tile grid location that is different from a tile grid location of the selected tile instance.

3. The method of claim 2
    wherein using the overall model of substrate behavior represented by the tile grid to compute a voltage includes using a linear solver to compute such computed voltage.

4. The method of claim 1 further including:
    using the overall model of substrate behavior represented by the tile grid to compute a voltage associated with a tile instance at a tile grid location that is different from a tile grid location of the selected tile instance;
    wherein selected tile instance is mapped to a substrate location adjacent digital circuitry; and
    wherein the different grid location is mapped to a substrate location adjacent analog circuitry.

5. A method to evaluate substrate noise propagation in an integrated circuit design comprising:
    providing a tile definition that specifies an electrical model associated with instances of the tile that represents electrical behavior of a representative portion of the substrate and that specifies a physical dimension associated with instances of the tile that is indicative of area encompassed by the tile instance;
    mapping, using a computer, a plurality of respective tile instances to respective locations of the substrate that have electrical behavior of the representative portion;

connecting the mapped tile instances to each other to produce a tile grid that models overall electrical behavior of the substrate;

associating a voltage with a selected tile instance of the tile grid that is indicative of substrate noise injection to the selected tile instance;

identifying respective power grid contacts encompassed by respective physical dimensions of tile instances mapped to respective locations of the substrate;

providing respective waveforms indicative of digital switching induced power grid fluctuations associated with the respective identified contacts; and wherein the voltage associated with the selected tile instance is indicative of substrate noise injection to the selected tile instance due to obtained waveforms associated with contacts identified as encompassed by the physical dimension specified for the selected tile instance.

6. The method of claim 5, wherein the respective contacts include power grid contacts to respective cell instances in the integrated circuit design.

7. The method of claim 5, wherein providing respective waveforms includes providing IR drop waveforms produced by a DPGA process.

8. The method of claim 5, wherein providing a tile definition includes providing a tile definition that specifies multiple connection nodes;

wherein connecting the mapped tile instances includes connecting respective tile instance connection nodes so as to connect tile instances to each other to model overall electrical behavior of the substrate; and wherein associating a voltage with a tile instance includes associating a voltage with a connection node of the selected tile instance.

9. The method of claim 5, wherein associating a voltage with a selected tile instance of the tile grid includes associating a worst case voltage waveform with the electrical model specified for a selected tile instance, from among waveforms associated with contacts identified as encompassed by the physical dimension specified for the selected tile instance.

10. The method of claim 9, wherein the worst case waveform is a waveform with a highest peak voltage from among waveforms associated with contacts identified as encompassed by the by a physical dimension specified for the selected tile instance.

11. The method of claim 9, wherein the worst case waveform is a waveform with a largest RMS voltage from among waveforms associated with contacts identified as encompassed by the by a physical dimension specified for the selected tile instance.

12. The method of claim 1, wherein providing multiple different tile definitions includes providing at least two different tile definitions respectively associated with at least two different types of tile instances that specify at least two different electrical models that respectively represent electrical behaviors of at least two different representative portions of the substrate having different electrical characteristics.

13. The method of claim 1, wherein providing respective tile definitions includes providing respective tile definitions that specify respective physical dimensions associated with respective tile instances in terms of at least a shape.

14. A method to evaluate substrate noise propagation in an integrated circuit design comprising:

providing a tile definition that specifies an electrical model associated with instances of the tile that represents electrical behavior of a representative portion of the substrate and that specifies a physical dimension associated with instances of the tile that is indicative of area encompassed by the tile instance;

mapping, using a computer, a plurality of respective tile instances to respective locations of the substrate that have electrical behavior of the representative portion; and connecting the mapped tile instances to each other to produce a tile grid that models overall electrical behavior of the substrate;

associating a voltage with a selected tile instance of the tile grid that is indicative of substrate noise injection to the selected tile instance;

wherein providing a tile definition further includes providing multiple different respective tile type definitions, each associated with a different respective tile instance that specifies a corresponding different respective electrical model that represents electrical behavior of a respective representative portion of the substrate; and wherein mapping includes mapping respective tile instances to respective locations of the substrate having electrical behavior represented by respective electrical models specified by such mapped tile instances.

15. A system comprising:

means for providing a tile definition that specifies an electrical model associated with instances of the tile that represents electrical behavior of a representative portion of the substrate and that specifies a physical dimension associated with instances of the tile that is indicative of area encompassed by the tile instance;

means for mapping, using a computer, a plurality of respective tile instances to respective locations of the substrate that have electrical behavior of the representative portion;

means for connecting the mapped tile instances to each other to produce a tile grid that models overall electrical behavior of the substrate;

means for associating a voltage with a selected tile instance of the tile grid that is indicative of substrate noise injection to the selected tile instance;

means for identifying respective power grid contacts encompassed by respective physical dimensions of tile instances mapped to respective locations of the substrate;

means for providing respective waveforms indicative of digital switching induced power grid fluctuations associated with the respective identified contacts; and wherein the voltage associated with the selected tile instance is indicative of substrate noise injection to the selected tile instance due to obtained waveforms associated with contacts identified as encompassed by the physical dimension specified for the selected tile instance.

16. An information structure encoded in computer readable memory device used to represent noise injection to and propagation within an integrated circuit substrate, the information structure produced by a method comprising:

providing multiple different tile definitions;

wherein different tile definitions respectively specify multiple respective connection nodes in which at least one connection node is connectable to propagate noise between such connection node and a connection node of another tile instance and in which at least one connection node is connectable for use as at least one of a noise injection node or as a noise observation node and in which at least two respective connection nodes are electrically connected to propagate noise between them;

wherein different tile definitions respectively correspond to different portions of the substrate having different physical characteristics;

wherein different tile definitions respectively specify different electrical models for their different corresponding substrate portions having such different physical characteristics in terms of electrical behavior of noise propagation between the at least two respective connection nodes: and wherein different tile definitions respectively specify respective physical dimensions encompassed by the respective tile definitions;

mapping, using a computer, respective tile instances specified by different tile definitions to respective portions of the substrate that correspond to such respective definitions; and connecting respective connection nodes of the mapped tile instances to each other to produce a tile grid to propagate noise between tile instances to model overall electrical behavior of the substrate;

identifying respective power grid contacts encompassed by respective physical dimensions of respective tile instances mapped to respective portions of the substrate; and associating respective tile instances with respective contacts identified as encompassed by respective physical dimensions of such respective tile instances.

17. The article of manufacture of claim 16, wherein the method further includes:

using the overall model of substrate behavior represented by the tile grid to compute a voltage associated with a tile instance at a tile grid location that is different from a tile grid location of the selected tile instance.

18. The article of manufacture of claim 16, wherein the method further includes:

using the overall model of substrate behavior represented by the tile grid to compute a voltage associated with a tile instance at a tile grid location that is different from a tile grid location of the selected tile instance;

wherein selected tile instance is mapped to a substrate location adjacent digital circuitry; and wherein the different grid location is mapped to a substrate location adjacent analog circuitry.

* * * * *

UNITED STATES PATENT AND TRADEMARK OFFICE
CERTIFICATE OF CORRECTION

| | | |
|---|---|---|
| PATENT NO. | : 7,877,713 B2 | Page 1 of 1 |
| APPLICATION NO. | : 11/769670 | |
| DATED | : January 25, 2011 | |
| INVENTOR(S) | : Vinod Kariat et al. | |

It is certified that error appears in the above-identified patent and that said Letters Patent is hereby corrected as shown below:

In column 1, line 11, delete "RELATEDSYSTEM" and insert -- RELATED SYSTEM --, therefor.

In column 4, line 14, delete "of a a tile" and insert -- of a tile --, therefor.

In column 10, line 65, delete "VDD" and insert -- $V_{DD}$ --, therefor.

In column 10, line 66, delete "VDD" and insert -- $V_{DD}$ --, therefor.

In column 10, line 66, delete "VDD" and insert -- $V_{DD}$ --, therefor.

In column 11, line 2, delete "VDD-connected" and insert -- $V_{DD}$-connected --, therefor.

In column 12, line 39, delete "VotageStorm™," and insert -- VoltageStorm™, --, therefor.

In column 13, line 48, delete "Thevinin" and insert -- Thevenin --, therefor.

In column 14, line 47, delete "for a for" and insert -- for a --, therefor.

In column 16, line 54, delete "$i_0$ th" and insert -- $i_0^{th}$ --, therefor.

In column 19, line 47, in Claim 10, delete "by the by a" and insert -- by the --, therefor.

In column 19, line 53, in Claim 11, delete "by the by a" and insert -- by the --, therefor.

In column 21, line 16, in Claim 16, delete "nodes:" and insert -- nodes; --, therefor.

Signed and Sealed this
Seventh Day of June, 2011

David J. Kappos
*Director of the United States Patent and Trademark Office*